(12) United States Patent
Mears et al.

(10) Patent No.: US 7,812,339 B2
(45) Date of Patent: Oct. 12, 2010

(54) METHOD FOR MAKING A SEMICONDUCTOR DEVICE INCLUDING SHALLOW TRENCH ISOLATION (STI) REGIONS WITH MASKLESS SUPERLATTICE DEPOSITION FOLLOWING STI FORMATION AND RELATED STRUCTURES

(75) Inventors: Robert J. Mears, Wellesley, MA (US); Kalipatnam Vivek Rao, Grafton, MA (US)

(73) Assignee: Mears Technologies, Inc., Waltham, MA (US)

( * ) Notice: Subject to any disclaimer, the term of this patent is extended or adjusted under 35 U.S.C. 154(b) by 230 days.

(21) Appl. No.: 12/102,305

(22) Filed: Apr. 14, 2008

(65) Prior Publication Data
US 2008/0258134 A1    Oct. 23, 2008

Related U.S. Application Data

(60) Provisional application No. 60/913,398, filed on Apr. 23, 2007.

(51) Int. Cl.
*H01L 29/06* (2006.01)
(52) U.S. Cl. .............................. 257/15; 257/17; 257/28; 257/510; 257/E29.075; 438/221; 438/222; 438/410; 438/413
(58) Field of Classification Search .................. 257/15, 257/17, 28, 510, E29.075; 438/221, 222, 438/410, 413
See application file for complete search history.

(56) References Cited

U.S. PATENT DOCUMENTS

| | | | |
|---|---|---|---|
| 4,485,128 A | 11/1984 | Dalal et al. | 427/85 |
| 4,594,603 A | 6/1986 | Holonyak, Jr. | 357/16 |
| 4,882,609 A | 11/1989 | Schubert et al. | 357/22 |

(Continued)

FOREIGN PATENT DOCUMENTS

EP     0843361     5/1998

(Continued)

OTHER PUBLICATIONS

Luo et al., *Chemical Design of Direct-Gap Light-Emitting Silicon*, published Jul. 25, 2002, The American Physical Society; vol. 89, No. 7.

(Continued)

*Primary Examiner*—Tu-Tu V Ho
(74) *Attorney, Agent, or Firm*—Allen, Dyer, Doppelt, Milbrath & Gilchrist, P.A.

(57) ABSTRACT

A semiconductor device may include a semiconductor substrate having a surface, a shallow trench isolation (STI) region in the semiconductor substrate and extending above the surface thereof, and a superlattice layer adjacent the surface of the semiconductor substrate and comprising a plurality of stacked groups of layers. More particularly, each group of layers of the superlattice layer may include a plurality of stacked base semiconductor monolayers defining a base semiconductor portion, and at least one non-semiconductor monolayer constrained within a crystal lattice of adjacent base semiconductor portions. Moreover, at least some atoms from opposing base semiconductor portions may be chemically bound together with the chemical bonds traversing the at least one intervening non-semiconductor monolayer. The semiconductor device may further include a lateral spacer between the superlattice layer and the STI region and which may include a lower non-monocrystalline semiconductor superlattice portion and an upper dielectric portion.

23 Claims, 28 Drawing Sheets

U.S. PATENT DOCUMENTS

| | | | | |
|---|---|---|---|---|
| 4,908,678 | A | 3/1990 | Yamazaki | 357/4 |
| 4,937,204 | A | 6/1990 | Ishibashi et al. | 437/110 |
| 4,969,031 | A | 11/1990 | Kobayashi et al. | 357/63 |
| 5,055,887 | A | 10/1991 | Yamazaki | 357/4 |
| 5,081,513 | A | 1/1992 | Jackson et al. | 357/23.7 |
| 5,216,262 | A | 6/1993 | Tsu | 257/17 |
| 5,357,119 | A | 10/1994 | Wang et al. | 257/18 |
| 5,420,442 | A * | 5/1995 | Hasenberg et al. | 257/22 |
| 5,576,221 | A | 11/1996 | Takemura et al. | 437/2 |
| 5,577,061 | A | 11/1996 | Hasenberg et al. | 372/45 |
| 5,594,567 | A | 1/1997 | Akiyama et al. | 349/28 |
| 5,606,177 | A | 2/1997 | Wallace et al. | 257/25 |
| 5,616,515 | A | 4/1997 | Okuno | 438/478 |
| 5,627,386 | A | 5/1997 | Harvey et al. | 257/79 |
| 5,683,934 | A | 11/1997 | Candelaria | 437/134 |
| 5,684,817 | A | 11/1997 | Houdre et al. | 372/45 |
| 5,994,164 | A | 11/1999 | Fonash et al. | 438/97 |
| 6,058,127 | A | 5/2000 | Joannopoulos et al. | 372/92 |
| 6,255,150 | B1 | 7/2001 | Wilk et al. | 438/191 |
| 6,274,007 | B1 | 8/2001 | Smirnov et al. | 204/192 |
| 6,281,518 | B1 | 8/2001 | Sato | 257/13 |
| 6,281,532 | B1 | 8/2001 | Doyle et al. | 257/288 |
| 6,326,311 | B1 | 12/2001 | Ueda et al. | 438/694 |
| 6,344,271 | B1 | 2/2002 | Yadav et al. | 428/402 |
| 6,350,993 | B1 | 2/2002 | Chu et al. | 257/19 |
| 6,376,337 | B1 | 4/2002 | Wang et al. | 438/478 |
| 6,436,784 | B1 | 8/2002 | Allam | 438/380 |
| 6,472,685 | B2 | 10/2002 | Takagi | 257/77 |
| 6,498,359 | B2 | 12/2002 | Schmidt et al. | 257/190 |
| 6,501,092 | B1 | 12/2002 | Nikonov et al. | 257/29 |
| 6,521,549 | B1 | 2/2003 | Kamath et al. | 438/786 |
| 6,566,679 | B2 | 5/2003 | Nikonov et al. | 257/29 |
| 6,608,327 | B1 | 8/2003 | Davis et al. | 257/76 |
| 6,621,097 | B2 | 9/2003 | Nikonov et al. | 257/17 |
| 6,638,838 | B1 | 10/2003 | Eisenbeiser et al. | 438/481 |
| 6,646,293 | B2 | 11/2003 | Emrick et al. | 257/194 |
| 6,673,646 | B2 | 1/2004 | Droopad | 438/85 |
| 6,690,699 | B2 | 2/2004 | Capasso et al. | 372/44 |
| 6,711,191 | B1 | 3/2004 | Kozaki et al. | 372/43 |
| 6,748,002 | B2 | 6/2004 | Shveykin | 372/45 |
| 6,816,530 | B2 | 11/2004 | Capasso et al. | 372/50 |
| 7,023,010 | B2 | 4/2006 | Wang et al. | 257/15 |
| 2002/0094003 | A1 | 7/2002 | Bour et al. | 372/46 |
| 2003/0034529 | A1 | 2/2003 | Fitzgerald et al. | 257/369 |
| 2003/0057416 | A1 | 3/2003 | Currie et al. | 257/19 |
| 2003/0089899 | A1 | 5/2003 | Lieber et al. | 257/9 |
| 2003/0162335 | A1 | 8/2003 | Yuki et al. | 438/151 |
| 2003/0206691 | A1 | 11/2003 | Puzey | 385/24 |
| 2003/0215990 | A1 | 11/2003 | Fitzgerald et al. | 438/172 |
| 2004/0084781 | A1 | 5/2004 | Ahn et al. | 257/777 |
| 2004/0227165 | A1 | 11/2004 | Wang et al. | 257/222 |
| 2005/0277271 | A1 | 12/2005 | Beintner et al. | 438/478 |
| 2006/0267130 | A1 | 11/2006 | Rao | 257/499 |
| 2006/0270169 | A1 | 11/2006 | Rao | 438/294 |

FOREIGN PATENT DOCUMENTS

| | | |
|---|---|---|
| GB | 2347520 | 9/2000 |
| JP | 61027681 | 2/1986 |
| JP | 61145820 | 7/1986 |
| JP | 61220339 | 9/1986 |
| JP | 62219665 | 9/1987 |
| WO | 99/63580 | 12/1999 |
| WO | 02/103767 | 12/2002 |

OTHER PUBLICATIONS

Tsu, *Phenomena in Silicon Nanostructure Devices*, University of North Carolina at Charlotte, Sep. 6, 2000.

Ye et al., *GaAs MOSFET with Oxide Gate Dielectric Grown by Atomic Layer Deposition*, Agere Systems, Mar. 2003.

Novikov et al., *Silicon-based Optoelectronics*, 1999-2003, pp. 1-6.

Fan et al., *N- and P-Type SiGe/Si Superlattice Coolers*, the Seventeenth Intersociety Conference on Thermomechanical Phenomena in Electronic Systems (ITherm 2000), vol. 1, pp. 304-307, Las Vegas, NV, May 2000.

Shah et at., *Experimental Analysis and Theoretical Model for Anomalously High Ideality Factors ($n>2.0$) in AlGaN/GaN P-N Junction Diodes*, Journal of Applied Physics, vol. 94, No. 4, Aug. 15, 2003.

Ball, *Striped Nanowires Shrink Electronics*, news@nature.com, Feb. 7, 2002.

Fiory et al., *Light Emission from Silicon: Some Perspectives and Applications*, Journal of Electronic Materials, vol. 32, No. 10, 2003, pp. 1,043-1,051.

*Lecture 6: Light Emitting and Detecting Devices*, MSE 6001, Semiconductor Materials Lectures, Fall 2004.

*Harvard University Professor and Nanosys Co-Founder, Charlie Lieber, Raises the Stakes in the Development of Nanoscale Superlattice Structures and Nanodevices*, Feb. 8, 2002, Nanosys, Inc.

Grupp et al., *A New Junction Technology for Low-Resistance Contacts and Schottky Barrier MOSFETS*, 2005 International Workshop on Junction Technology.

Connelly et al., *A New Route to Zero-Barrier Metal Source/Drain Material*, IEEE Transactions on Nanotechnology, vol. 3, No. 1, Mar. 2004, pp. 98-104.

\* cited by examiner

METHOD FOR MAKING A SEMICONDUCTOR DEVICE INCLUDING SHALLOW TRENCH ISOLATION (STI) REGIONS WITH MASKLESS SUPERLATTICE DEPOSITION FOLLOWING STI FORMATION AND RELATED STRUCTURES

CROSS-REFERENCE TO RELATED APPLICATIONS

This application is based upon prior filed co-pending provisional application No. 60/913,398 filed Apr. 23, 2007, the entire subject matter of which is incorporated herein by reference in its entirety.

FIELD OF THE INVENTION

The present invention relates to the field of semiconductors, and, more particularly, to semiconductors having enhanced properties based upon energy band engineering and associated methods.

BACKGROUND OF THE INVENTION

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2$/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electromuminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc, can be tailored to yield new aperiodic materials with desirable band-structure characteristics. Other parameters, such as electrical conductivity, thermal conductivity and dielectric permittivity or magnetic permeability are disclosed as also possible to be designed into the material.

U.S. Patent App. Pub. No. 2006/0270169 to Rao discloses a method for making a semiconductor device that includes forming a plurality of shallow trench isolation (STI) regions in a semiconductor substrate. A plurality of layers are deposited over the substrate to define respective superlattices over the substrate between adjacent STI regions and to define respective non-monocrystalline regions over the STI regions. The method further includes selectively removing at least portions of the non-monocrystalline regions using at least one active area (AA) mask.

While this method is particular advantageously for implementing advanced, band-engineered superlattice materials with STI, further enhancements may be desirable when using STI regions. For example, depositing superlattice structures post-STI formation may ordinarily require a number of masking steps that it would be advantageous to avoid, if possible.

SUMMARY OF THE INVENTION

In view of the foregoing background, it is therefore an object of the present invention to provide semiconductor devices with enhanced semiconductor materials and STI regions and methods for more making the same.

This and other objects, features, and advantages are provided by a semiconductor device which may include a semiconductor substrate having a surface, one or more shallow trench isolation (STI) regions in the semiconductor substrate and extending above the surface thereof, and a superlattice layer adjacent the surface of the semiconductor substrate and comprising a plurality of stacked groups of layers. More particularly, each group of layers of the superlattice layer may include a plurality of stacked base semiconductor monolayers defining a base semiconductor portion, and at least one non-semiconductor monolayer constrained within a crystal lattice of adjacent base semiconductor portions. Moreover, at least some atoms from opposing base semiconductor portions may be chemically bound together, with the chemical bonds traversing the at least one intervening non-semiconductor monolayer. The semiconductor device may further include a lateral spacer between the superlattice layer and the STI region(s) and which may include a lower non-monocrystalline semiconductor superlattice portion and an upper dielectric portion.

By way of example, the upper dielectric portion may include an oxide. Furthermore, the lower non-monocrystalline semiconductor superlattice portion may include a plurality of stacked base non-monocrystalline semiconductor monolayers defining a non-monocrystalline base semiconductor portion and at least one non-semiconductor monolayer between adjacent base non-monocrystalline semiconductor portions. Additionally, the lateral spacer may extend vertically upward from the substrate and along a sidewall of the STI region. The semiconductor device may further include an oxide layer overlying the superlattice layer.

Each base semiconductor portion may comprise a base semiconductor selected from the group consisting of Group IV semiconductors, Group III-V semiconductors, and Group II-VI semiconductors, such as silicon, for example. Also by way of example, the at least one non-semiconductor monolayer may include a non-semiconductor selected from the group consisting of oxygen, nitrogen, fluorine, and carbon.

A related method of making a semiconductor device may include forming a shallow trench isolation (STI) region in a semiconductor substrate and extending above a surface thereof, and forming a superlattice layer adjacent the surface of the semiconductor substrate, such as the superlattice layer described briefly above. The method may further include forming a lateral spacer between the superlattice layer and the STI region and including a lower non-monocrystalline semiconductor superlattice portion and an upper dielectric portion.

DETAILED DESCRIPTION OF THE PREFERRED EMBODIMENTS

Figure 1:
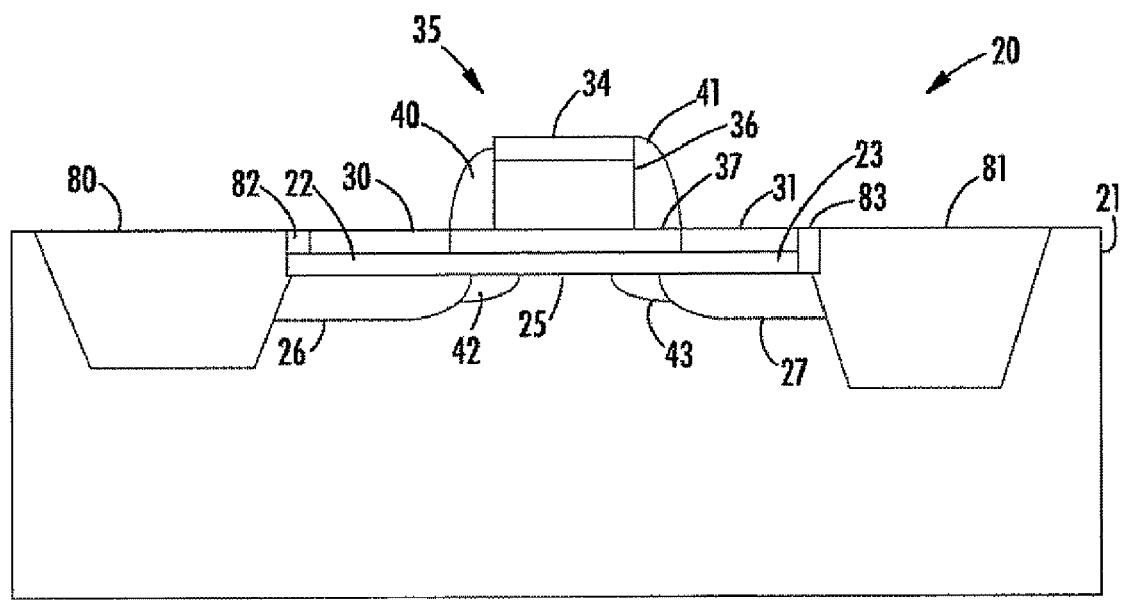
FIG. 1 is a cross-sectional view of a semiconductor device in accordance with the present invention including a superlattice.
Figure 2A:
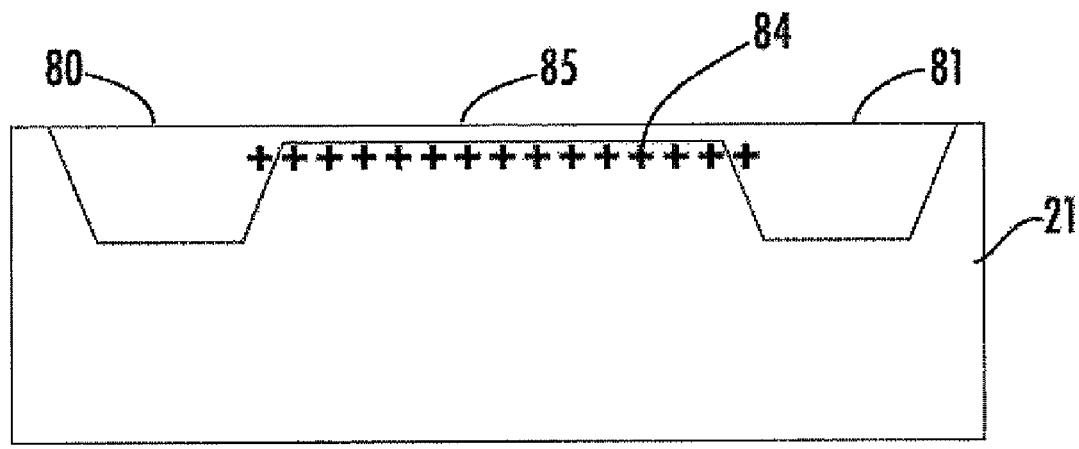
FIGS. 2A through 2D are cross-sectional views illustrating formation of the semiconductor device of FIG. 1 and potential difficulties associated therewith.
Figure 2B:
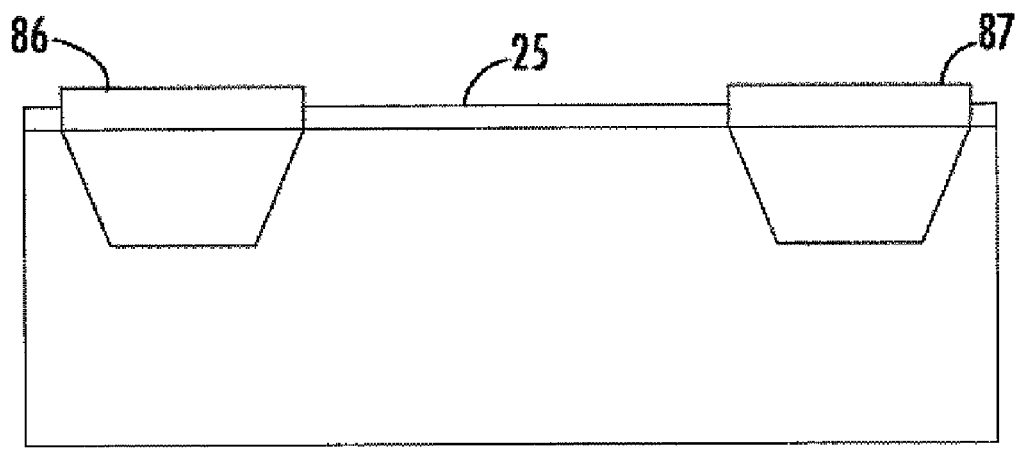
Figure 2C:
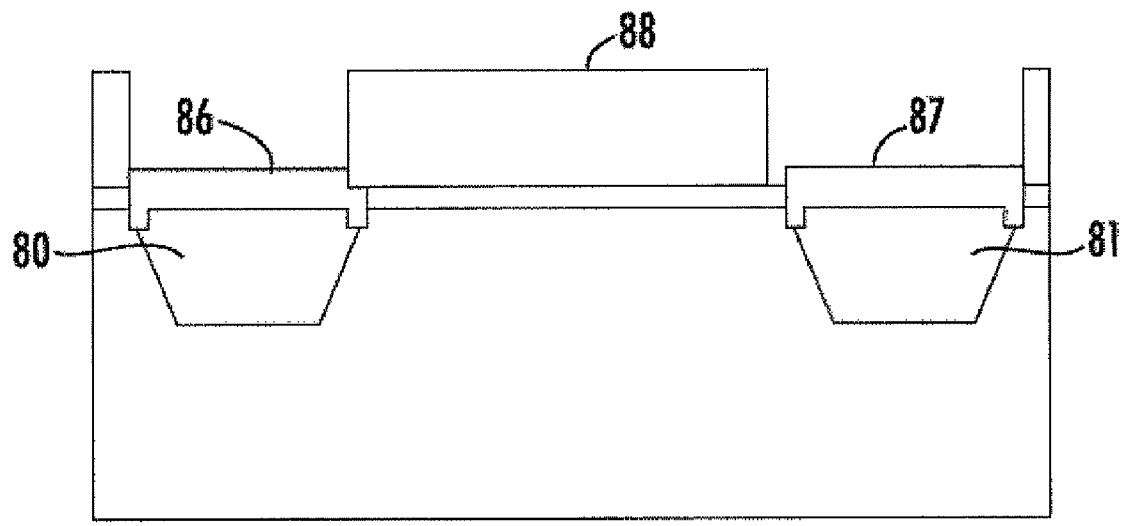
Figure 2D:
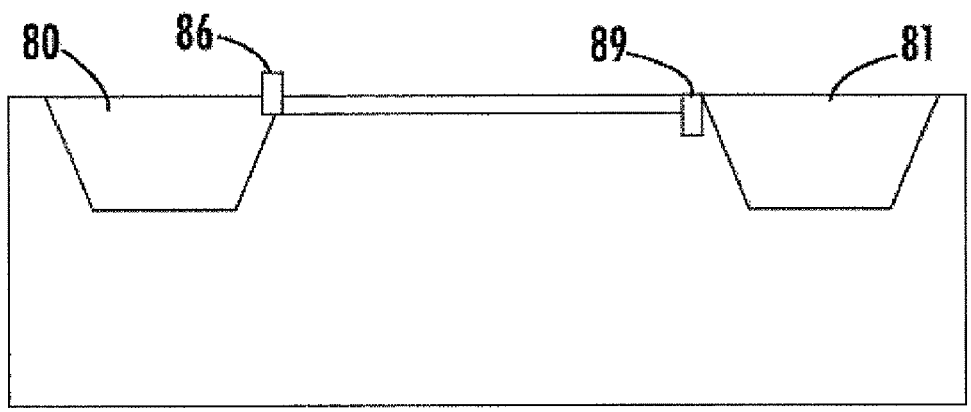
Figure 3:
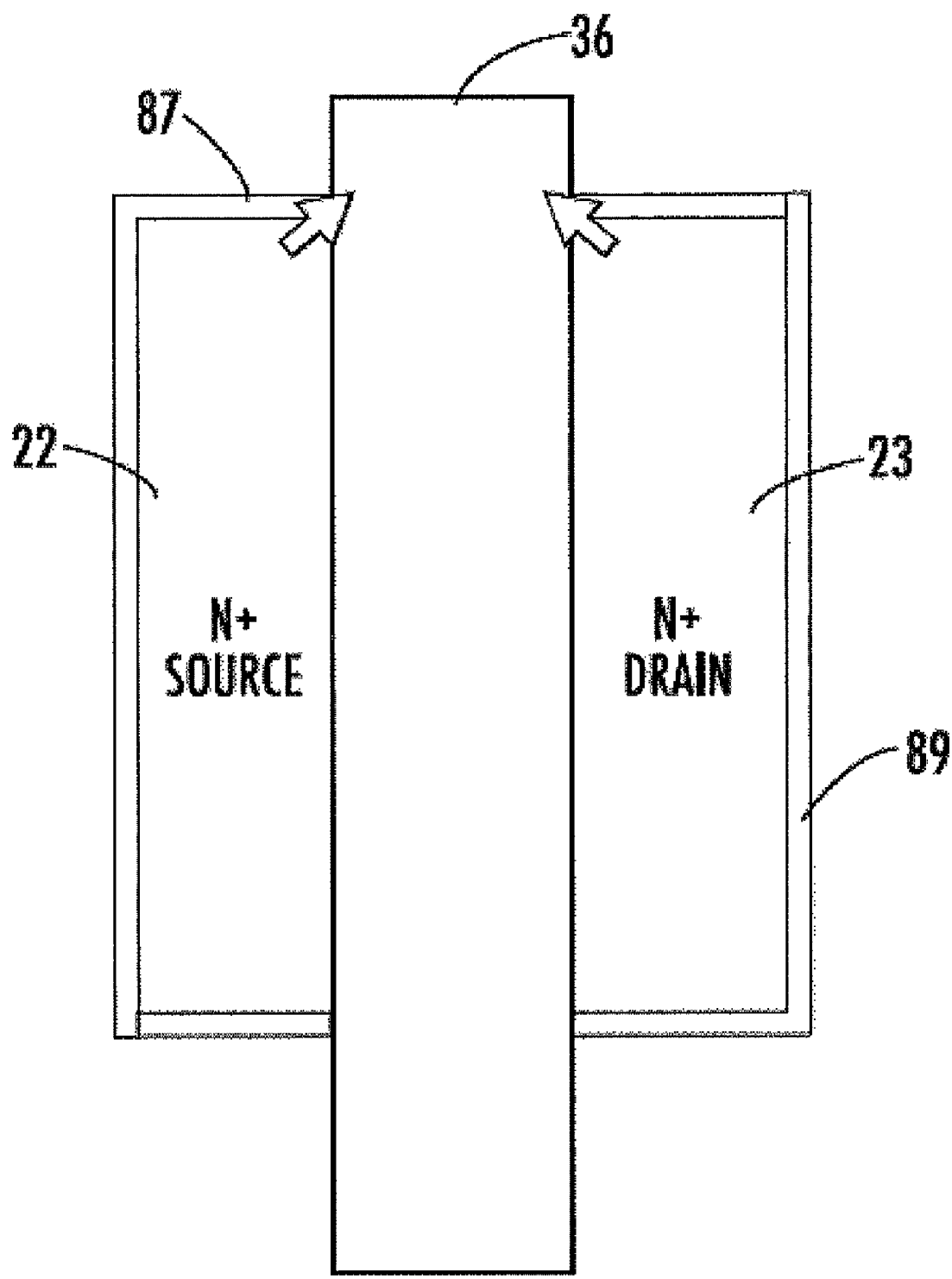
FIG. 3 is a top view of a portion of the semiconductor device of FIG. 1 after gate electrode pattern and etch.
Figure 4:
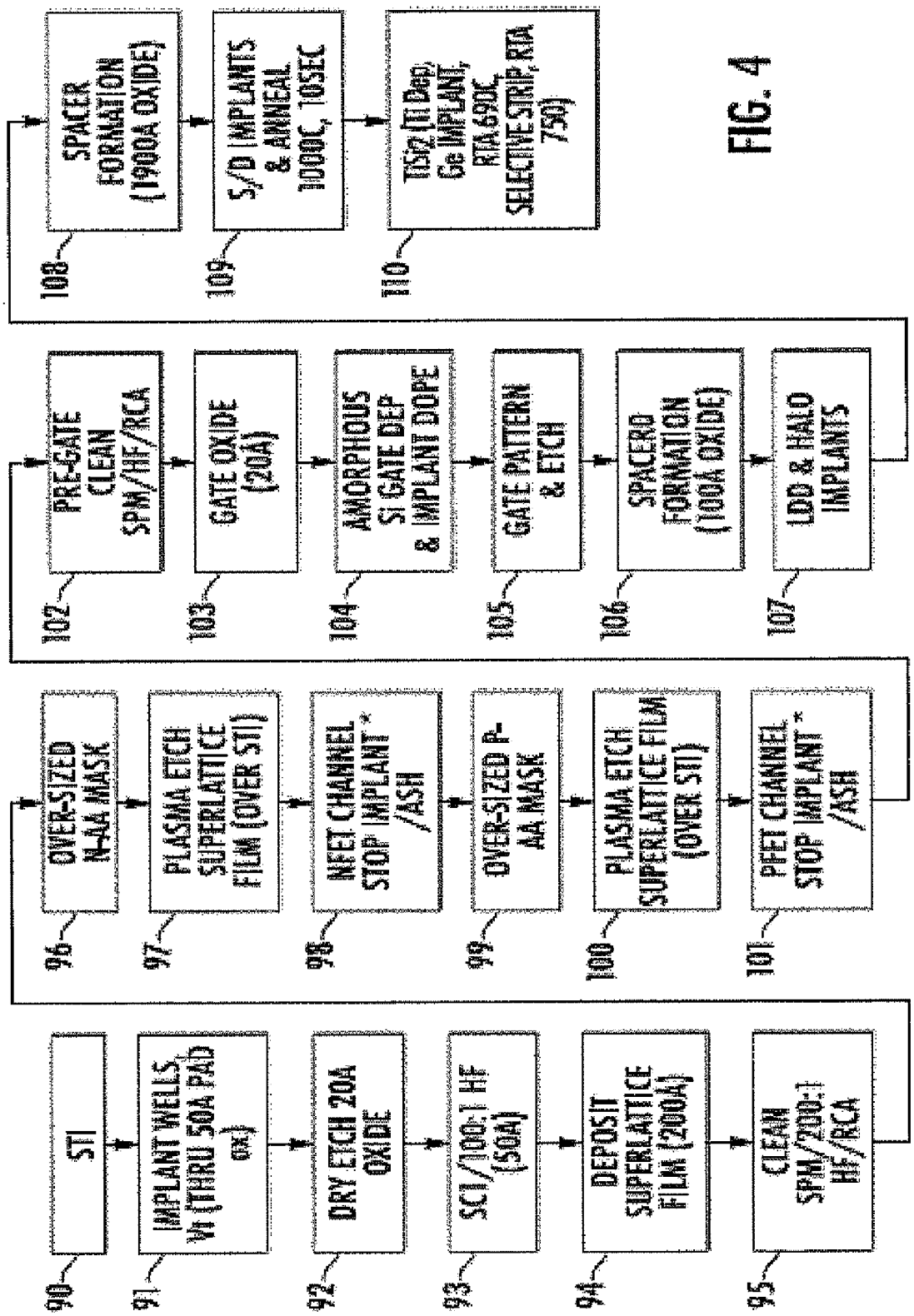
FIG. 4 is a flow diagram illustrating a process flow for making the semiconductor device of FIG. 1.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime and multiple prime notation are used to indicate similar elements in alternate embodiments.

The present invention relates to controlling the properties of semiconductor materials at the atomic or molecular level to achieve improved performance within semiconductor devices. Further, the invention relates to the identification, creation, and use of improved materials for use in the conduction paths of semiconductor devices.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensors", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,ij}^{-1}(E_F, T) = \frac{-\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature (Kelvin), E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensor. Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Using the above-described measures, one can select materials having improved band structures for specific purposes. One such example would be a superlattice 25 material for a channel region in a semiconductor device. A planar MOSFET 20 including the superlattice 25 in accordance with the invention is now first described with reference to FIG. 1. One skilled in the art, however, will appreciate that the materials identified herein could be used in many different types of semiconductor devices, such as discrete devices and/or integrated circuits.

The illustrated MOSFET 20 includes a substrate 21 with shallow trench isolation (STI) regions 80, 81 therein. More particularly, the MOSFET device 20 may be a complementary MOS (CMOS) device including N and P-channel transistors with respective superlattice channels, in which the STI regions are for electrically insulating adjacent transistors, as will be appreciated by those skilled in the art. By way of example, the substrate 21 may be a semiconductor (e.g., silicon) substrate or a silicon-on-insulator (SOI) substrate. The STI regions 80, 81 may include an oxide such as silicon dioxide, for example, although other suitable materials may be used in other embodiments.

The MOSFET 20 further illustratively includes lightly doped source/drain extension regions 22, 23, more heavily doped source/drain regions 26, 27, and a channel region therebetween provided by the superlattice 25. Halo implant regions 42, 43 are illustratively included between the source and drain regions 26, 27 below the superlattice 25. Source/drain silicide layers 30, 31 overlie the source/drain regions, as will be appreciated by those skilled in the art. A gate 35 illustratively includes a gate dielectric layer 37 adjacent the channel provided by the superlattice 25, and a gate electrode layer 36 on the gate dielectric layer. Sidewall spacers 40, 41 are also provided in the illustrated MOSFET 20, as well as a silicide layer 34 on the gate electrode layer 36.

Process integration of the superlattice 25 into state-of-the-art CMOS flow may require the removal of the superlattice film 25 that is formed over the STI regions 80, 81 to prevent shorting or leakage between adjacent device structures. Referring more particularly to FIGS. 2A-2D through 3, fabrication may begin with the substrate 21 which has the STI regions 80, 81 formed therein as well as a sacrificial oxide layer 85 thereon and a $V_T$ implant 84 (represented by a row of "+" signs). In the case of a crystalline silicon superlattice, which will be described further below, when the sacrificial oxide layer 85 is removed and the superlattice 25 is formed on the substrate 21, the silicon deposition results in non-monocrystalline (i.e., polycrystalline or amorphous) silicon deposits 86, 87 overlying the STI regions 80, 81. However, the non-monocrystalline silicon deposits 86, 87 typically need to be removed to prevent shorting or leakage between adjacent device structures, as noted above.

While a relatively straightforward approach of performing masking with a single baseline active area (AA) photoresist mask 88 (FIG. 2C) and subsequent etching of the non-monocrystalline silicon deposits 86, 87 (FIG. 2D) may be acceptable in some implementations, in other cases this can lead to certain difficulties. More particularly, if the mask is misaligned (resulting in a portion of the non-monocrystalline silicon deposit 86 on STI edges being masked by the photoresist 88) or due to insufficient over-etch during plasma etch, then portions of the non-monocrystalline silicon deposit on the STI edges and in the STI divots may remain unetched and hence remain as a parasitic device adjacent to the active device, while an active device area adjacent the STI region (due to channel stop mask misalignment) is inadvertently etched leaving a gap 89. The result is that dopant creep may unintentionally occur adjacent the non-monocrystalline silicon portion 86, while non-uniform silicide and source/drain junction leakage substrate may occur adjacent the gap 89.

Accordingly, the masking and etching operations may advantageously be modified to provide non-monocrystalline semiconductor stringers or unetched tabs 82, 83 with channel-stop implants in divots and edges of the STI regions 80, 81, as shown in FIG. 1. Again, the non-monocrystalline semiconductor deposition occurs during the epitaxial growth of the semiconductor monolayers of the superlattice 25, which over the STI regions 80, 81 results in a non-monocrystalline silicon. The non-monocrystalline stringers 82, 83 are preferably advantageously doped with a channel-stop implant dopant, for example, as will be discussed further in the various fabrication examples set forth below.

Referring more particularly to FIGS. 4 through 8, a first process integration flow for making the semiconductor device 20 is now described. Beginning with an STI wafer at Block 90, $V_T$ wells are implanted (through 150 Å pad oxide 85'), at Block 91, followed by a dry etch (120 Å oxide), at Block 92. This is followed by a hydrofluoric acid (HF) exposure (SC1/100:1, 50 Å), at Block 93. In particular, the partial dry etch of the pad oxide 85' and relatively short HF exposure time may help to reduce the depth of the STI divots, for example. Next, the superlattice film 25' is deposited, at Block 94, which will be discussed further below, followed by a cleaning step (SPM/200:1, HF/RCA), at Block 95.

Figure 5A:
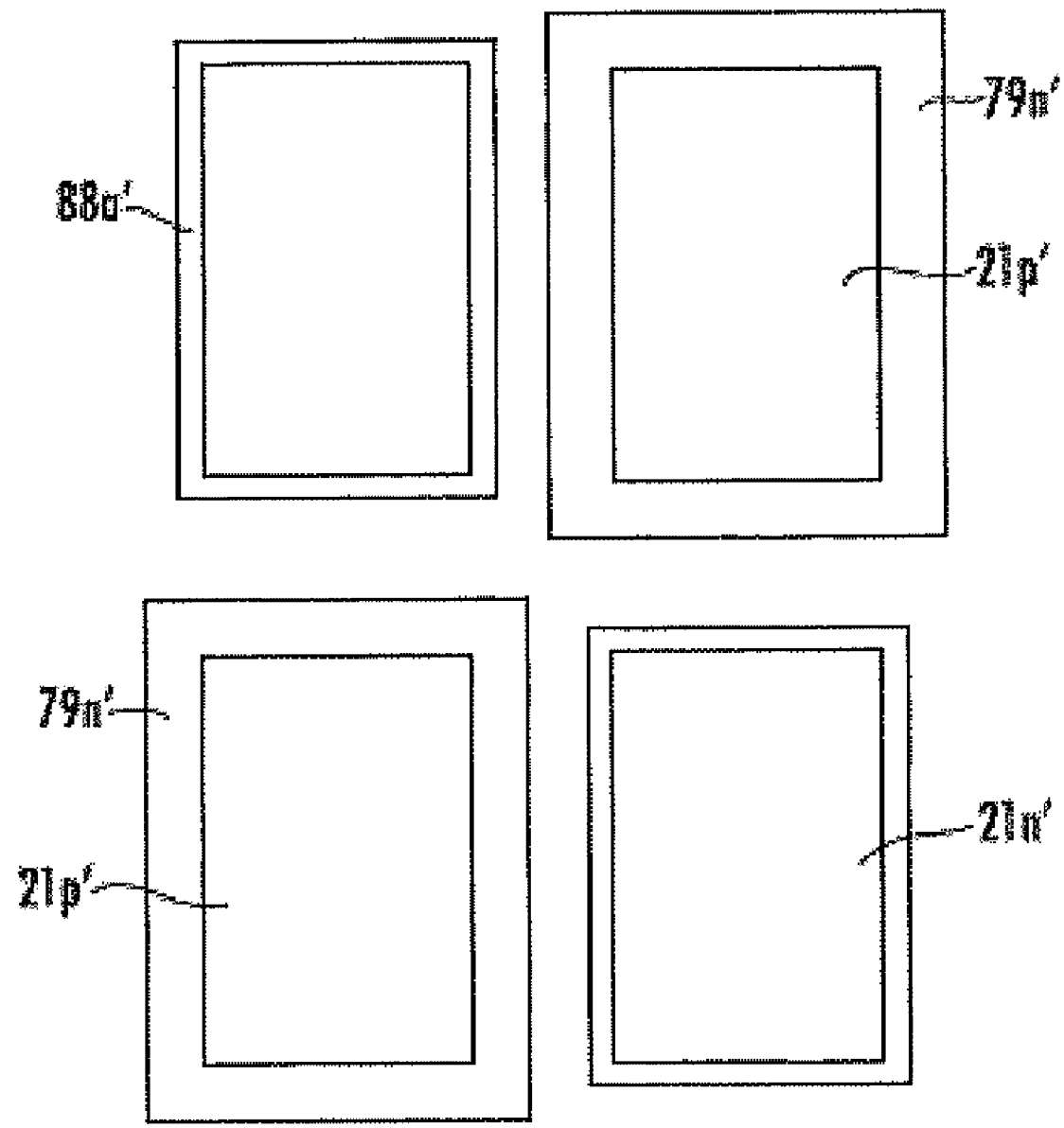
FIGS. 5A and 5B are top views of NFET and PFET channel-stop masks used in the method of FIG. 4.
Figure 5B:
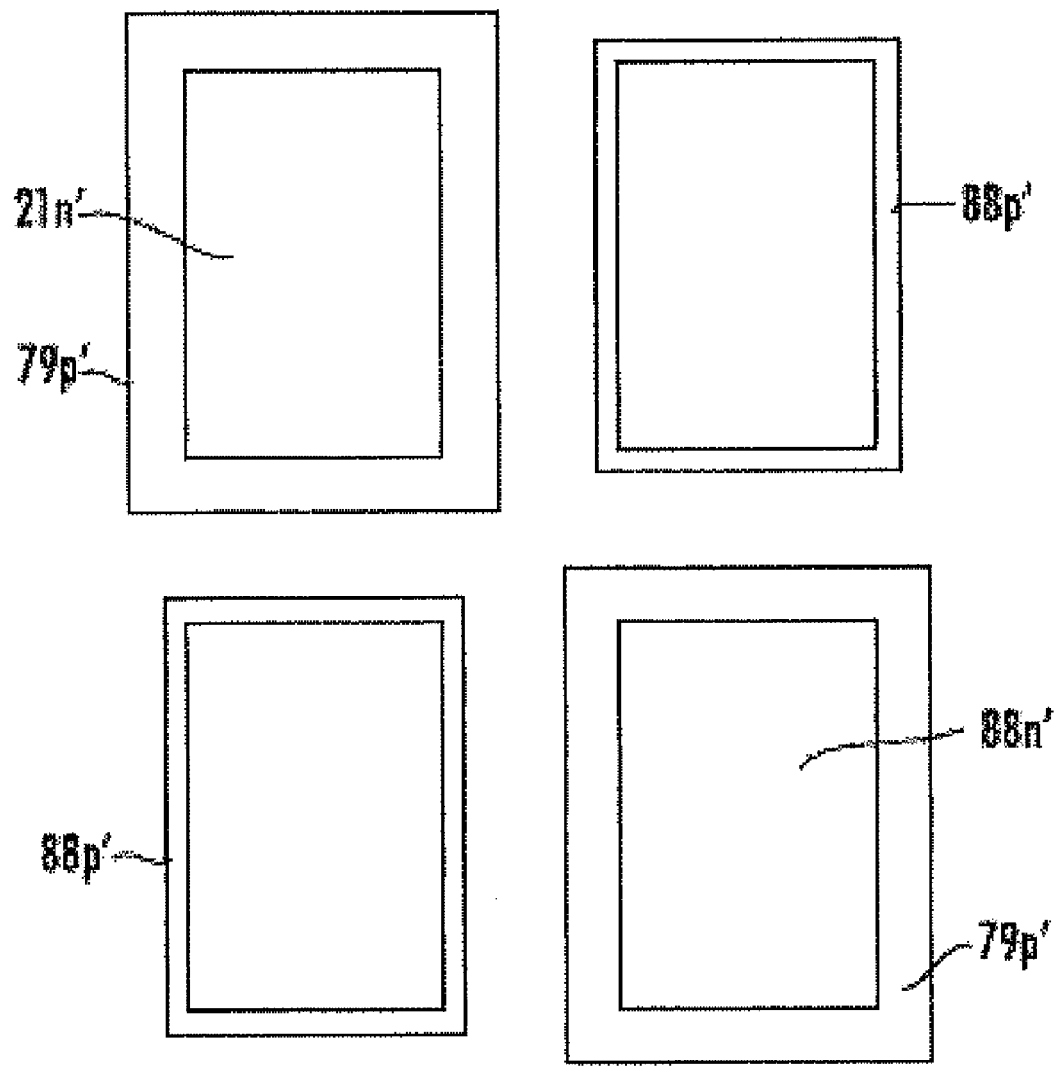
Figure 9:
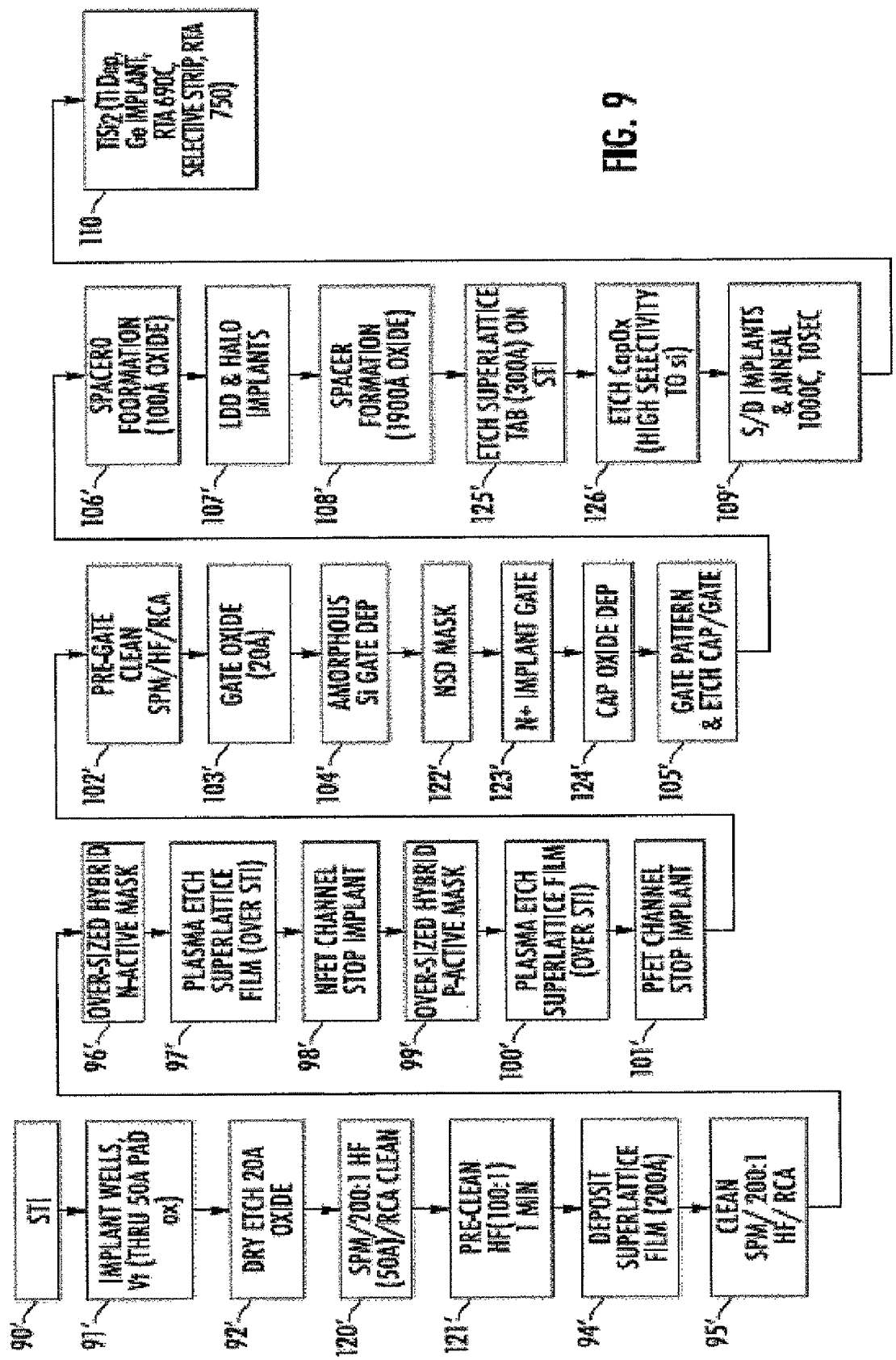
FIG. 9 is a flow diagram illustrating an alternative process flow for making the semiconductor device of FIG. 1.

Rather than using a single baseline AA mask as described above, in the present example a first, oversized N channel AA mask is formed (FIGS. 5A and 6A), at Block 96, followed by a plasma etch of the non-monocrystalline semiconductor material over the STI regions adjacent the N-channel regions (Block 97) and an NFET channel-stop implant (FIG. 9B) using the oversized N channel AA mask, at Block 98. In FIGS. 5A and 5B, the N and P oversized masks are indicated with reference numerals 88n' and 88p', respectively, and the N and P active areas are indicated with reference numerals 21n', 21p', respectively. Moreover, reverse N and P wells are indicated with reference numerals 79n' and 79p', respectively.

Figure 6A:
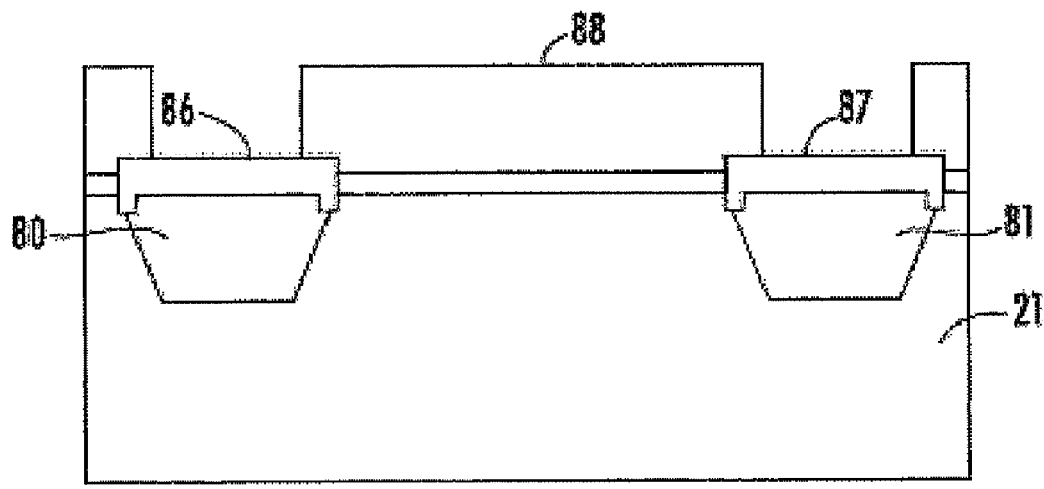
FIGS. 6A through 6B are cross-sectional views illustrating the masking and channel-stop implantation steps of the method of FIG. 4.
Figure 6B:
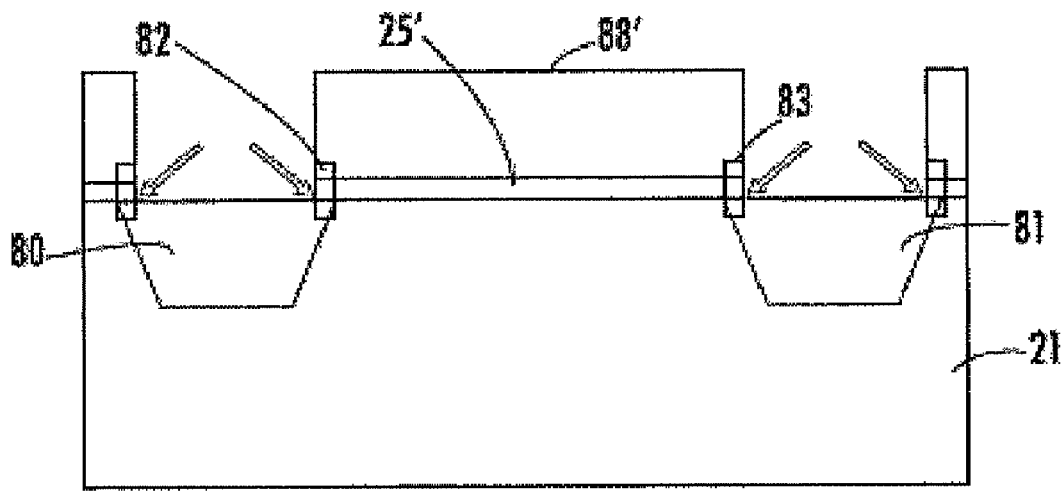
Figure 7:
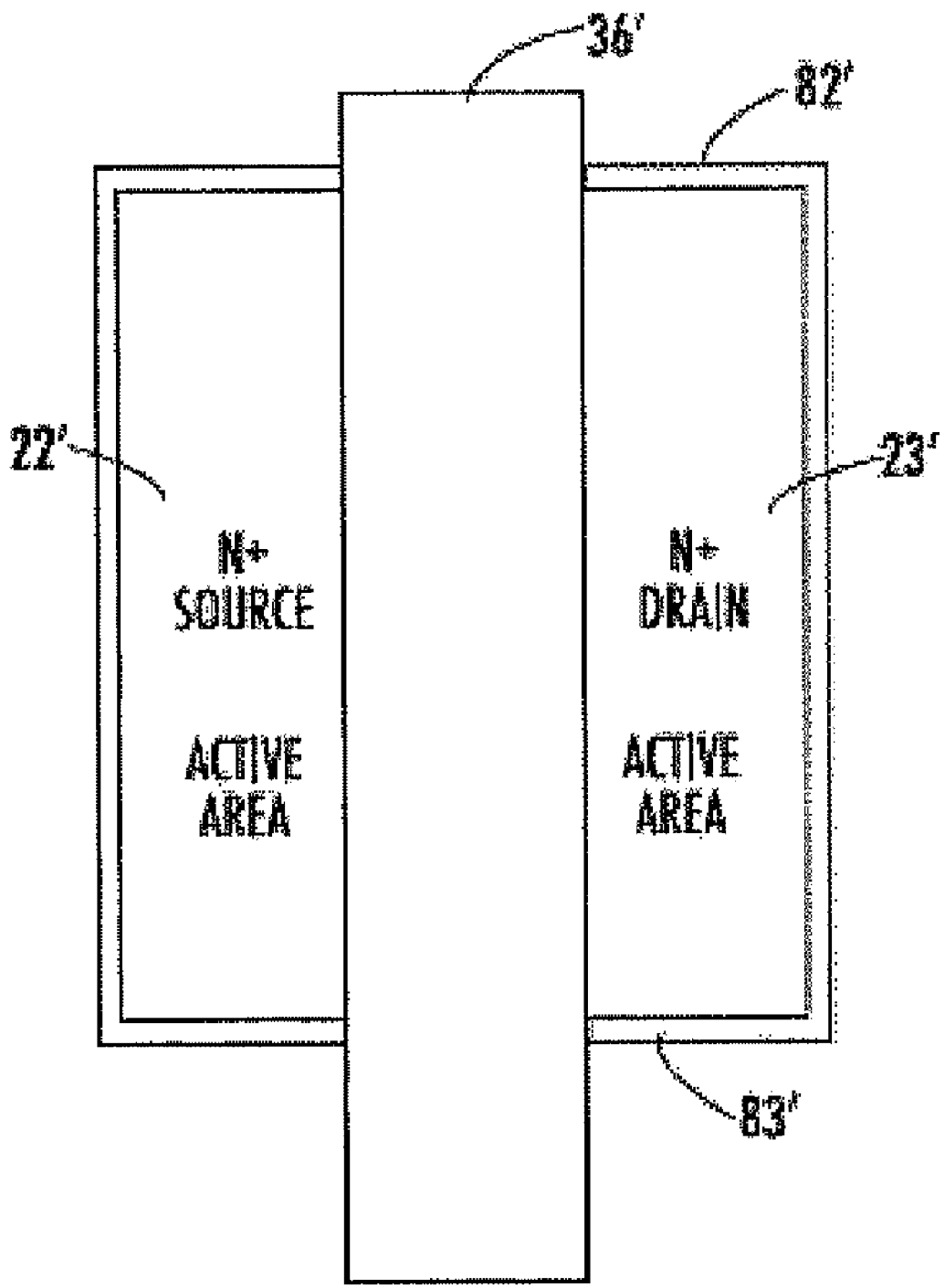
FIG. 7 is a top view of the device structure after gate electrode pattern and etch, showing the device regions where the channel-stop implant is targeted to benefit, as part of the method of FIG. 4.

Next, an over-sized P-channel mask is then formed (FIG. 5B), at Block 99, followed by a plasma etch of the non-monocrystalline silicon over the STI regions adjacent the P-channel region (Block 100) and the PFET channel-stop implantation, at Block 101. The NFET and PFET channel-stop implants are preferably performed at an angle or tilt, such as a thirty degree angle, for example, as illustrated in FIG. 6B, although other angles may also be used. The channel-stop implantations are illustratively shown with arrows in the drawings. By way of example, boron may be used for the NFET channel-stop implant, and arsenic or phosphorous may be used for the PFET channel-stop implant. The stringers 82', 83' in the STI region 80', 81' divots and unetched silicon tabs at STI edges are preferably highly counter-doped by the channel-stop implant to neutralize or lessen the diffusion creep of dopants from source-drain regions into the non-monocrystalline silicon in the STI divots or tabs at the corner of the channel of the device to advantageously provide a higher diode break down voltage, higher threshold voltage and lower off current of this parasitic edge device. The use of two different oversized masks for the P and N channel devices advantageously helps protect the AA alignment marks during the non-monocrystalline silicon etching, as well as to protect each active device during channel stop implant of the opposite type of device.

Figure 8A:
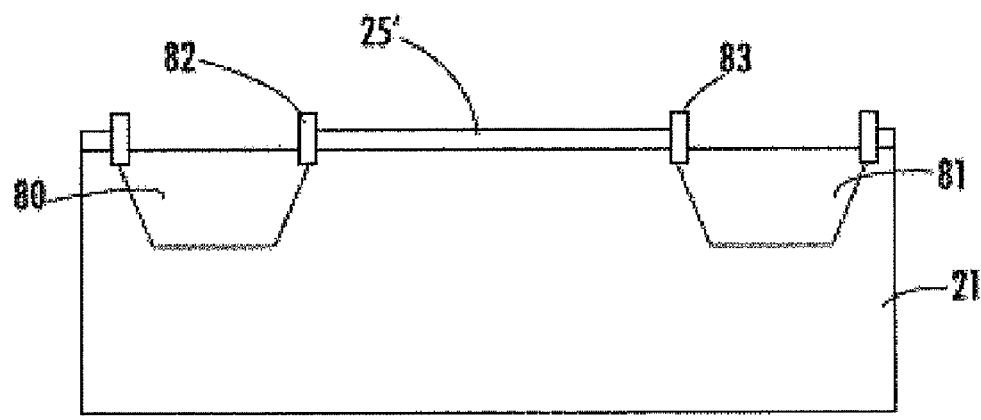
FIGS. 8A through 8C are cross-sectional views illustrating the resist stripping, gate doping, spacer formation, and source/drain doping steps of the method of FIG. 4.
Figure 8B:
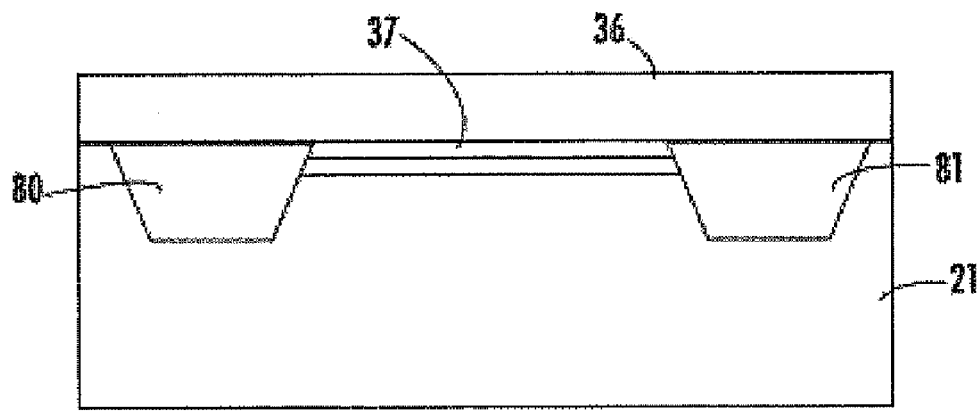
Figure 8C:
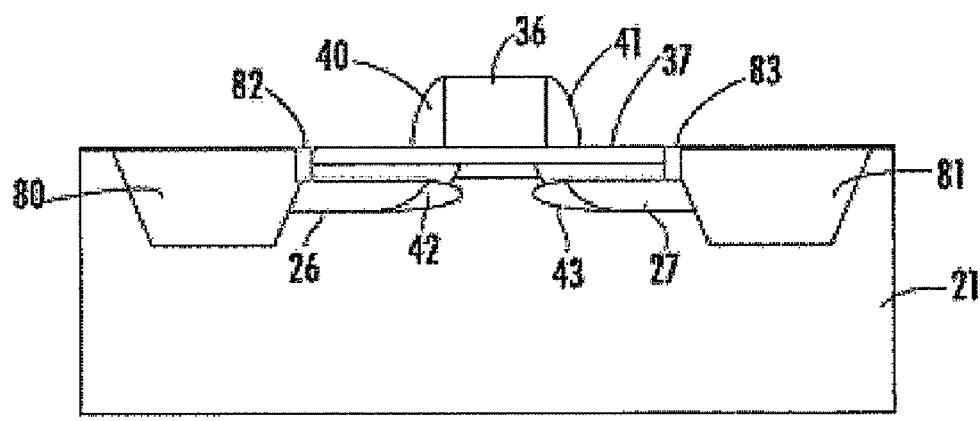

Once the PFET channel-stop implants are completed, a pre-gate clean (SPM/HF/RCA) is performed, at Block 102 (FIG. 8A), followed by gate oxide 37' formation (approximately 20 Å), at Block 103, and non-monocrystalline silicon gate electrode 36 deposition and implantation doping, at Block 104 (FIG. 8B). Gate patterning and etching is then performed, at Block 105, followed by sidewall spacer 40', 41' formation (e.g., 100 Å oxide) (Block 106) and LDD 22', 23 and halo 42', 43' implantations, at Block 107 (FIG. 5C). The spacers 40', 41' are then etched (e.g., 1900 Å oxide), at Block 108. The spacer 40, 41 formation is followed by the source/drain 26', 27' implants and annealing (e.g., 1000° C. for 10 seconds), at Block 109, and silicide formation (Block 110) to provide the device 20 shown in FIG. 1. More particularly, the silicide may be $TiSi_2$ (e.g., Ti deposition, germanium implant, RTA @ 690° C., selective strip, followed by RTA at 750° C.).

Figure 12A:
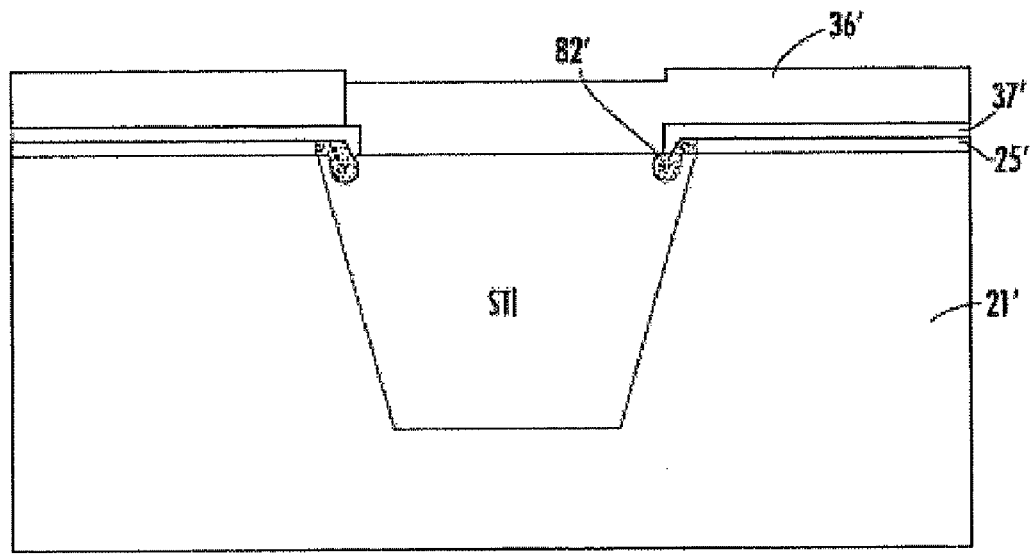
FIGS. 12A and 12B are cross-sectional views of the device structure after silicide formation taken parallel and perpendicular to the gate layer, respectively.
Figure 12B:
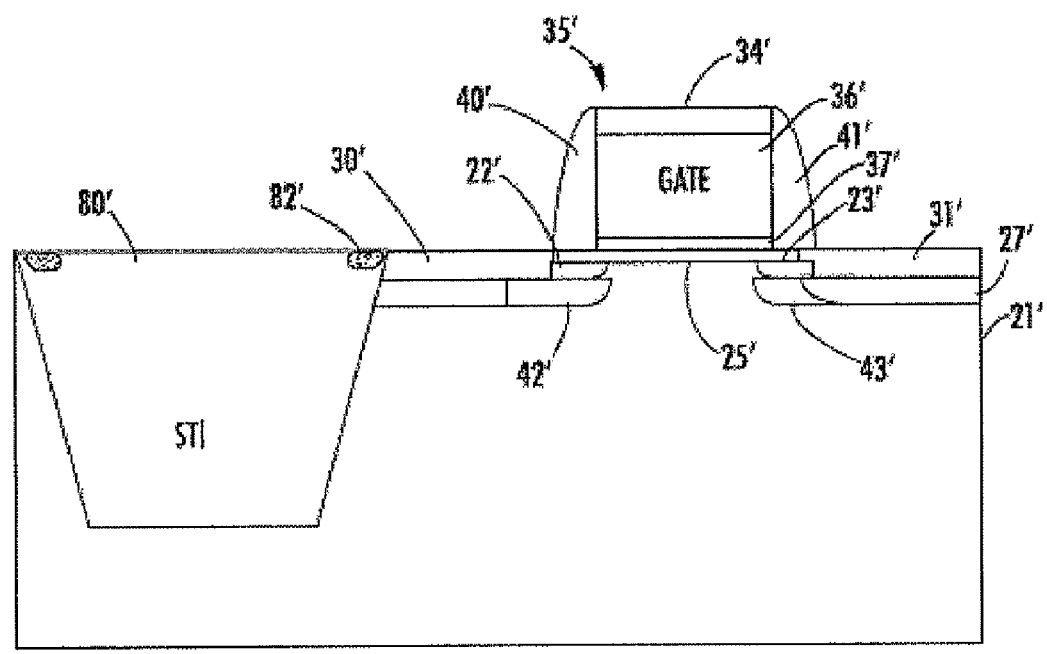

FIGS. 12A and 12B are cross-sectional views of the device structure after silicide formation taken parallel and perpendicular to the gate layer 36', respectively. In these figures, the non-monocrystalline stringers 82', 83' are shown with stippling to indicate that they have been doped with the channel-stop implant. It should be noted that the depth of the silicon recess in the source/drain areas will depend upon the amount of over-etch used to remove the non-monocrystalline stringers and unetched tabs (due to use of oversized active-area channel-stop masks) 82', 83' in the STI divots and STI edges. Moreover, excessive recesses may lead to increased series RSD or loss of contact between the source/drain and the LDD regions, as will be appreciated by those skilled in the art. As such, these depths may require adjustment depending upon the given implantation.

In the above-noted process flow, the NFET and PFET masking, etching of the non-monocrystalline silicon 86', 87' over the STI regions 80', 81', and channel-stop implants are performed prior to gate oxidation. In an alternative process flow now described with reference to FIGS. 9 through 11, the above-described approach is modified so that etching of the non-monocrystalline silicon 86', 87' is performed after the spacer etching step (Block 108'). Moreover, this alternative process flow also uses an oxide or nitride cap film 78'' (FIG. 10B) over the gate electrode layer 36'' to protect the gate polysilicon from being etched during the etching of the non-monocrystalline silicon 86'', 87''.

Figure 10A:
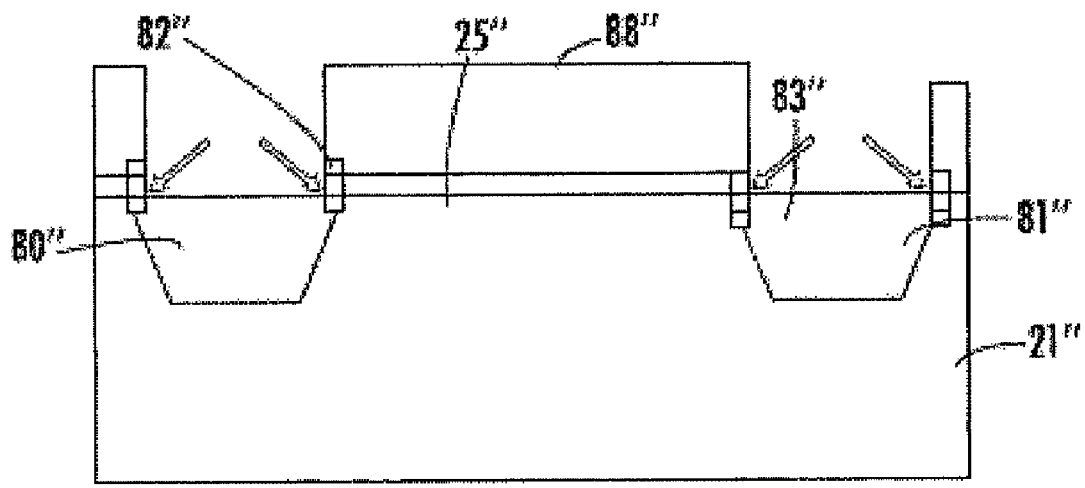
FIGS. 10A through 10B are cross-sectional views illustrating the non-monocrystalline semiconductor etching, channel-stop implant, and gate deposition/implantation steps of the method of FIG. 9.
Figure 10B:
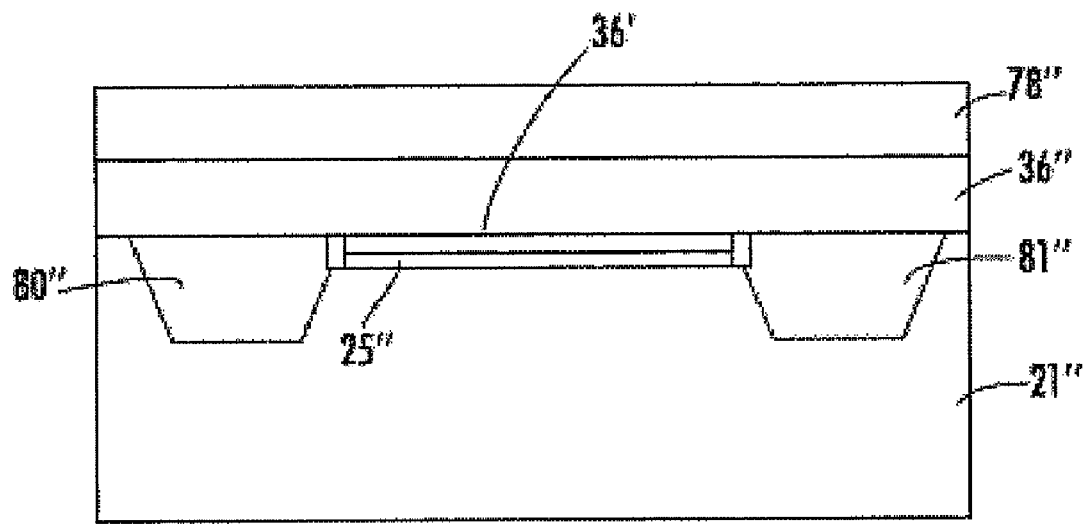
Figure 11:
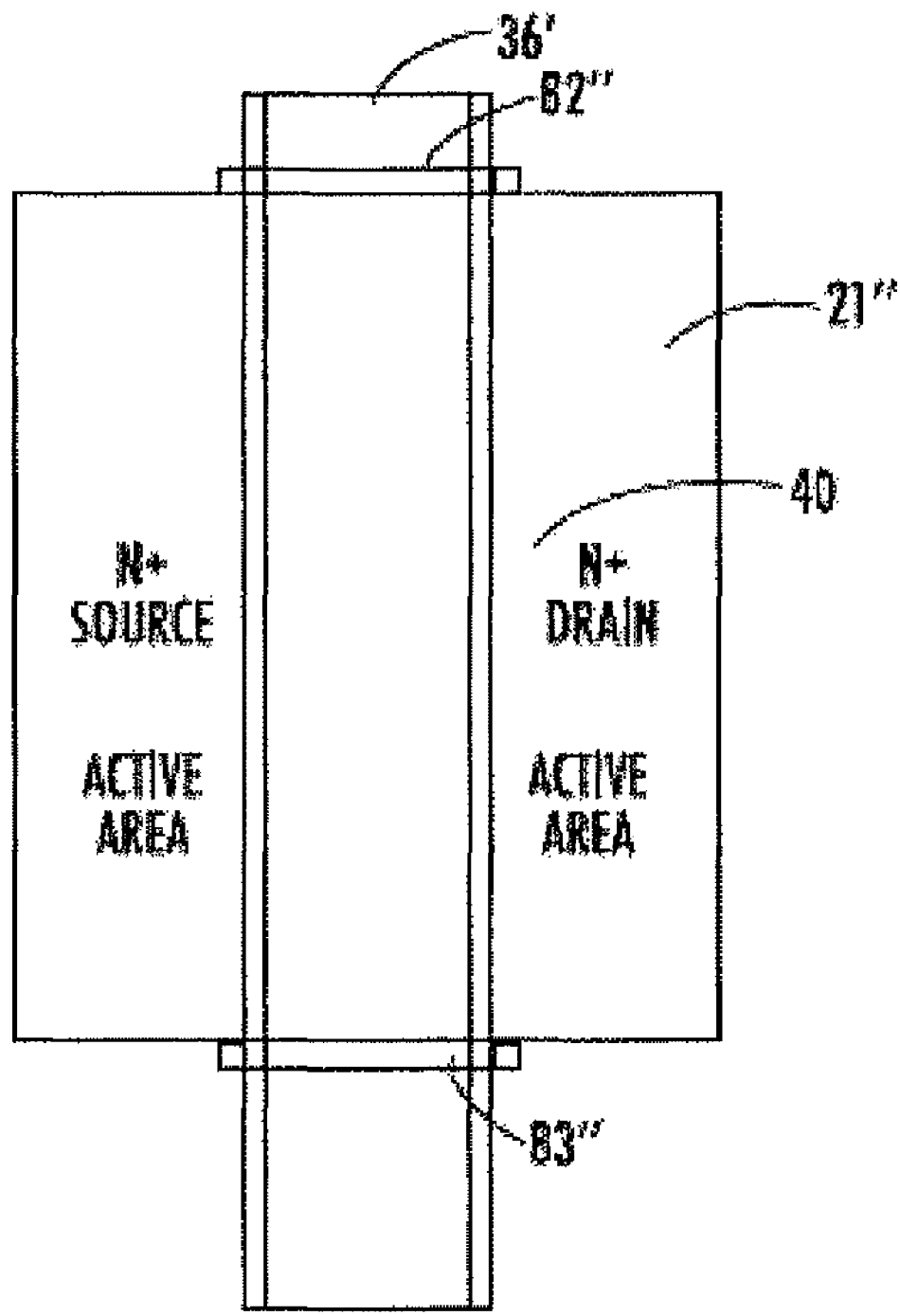
FIG. 11 is a top view of the device structure after the spacer formation step of the method of FIG. 9.

After dry etching (Block 92'), a cleaning step (SPM/200:1, HF (50 Å)/RCA) is performed, at Block 120', followed by an HF pre-clean (100:1) for approximately one minute. For the NFET and PFET masking deposition steps (Blocks 96', 99'), in the present example oversized hybrid photoresist masks are used (FIG. 10A). Additionally, after the non-monocrystalline silicon gate electrode layer 36'' deposition (Block 104'), the illustrated method includes an NSD masking step (Block 122'), followed by an N+ gate implant and cap oxide deposition, at Blocks 123', 124'. Other process variations from the above-described approach include an etching of the non-monocrystalline silicon 86'', 87'' on the STI regions 80'', 81'' (e.g., 300 Å), at Block 125', followed by etching of the cap oxide layer (with a high selectivity to silicon), at Block 126'. Those remaining process steps not specifically discussed here are similar to those discussed above with reference to FIG. 4.

Figure 13A:
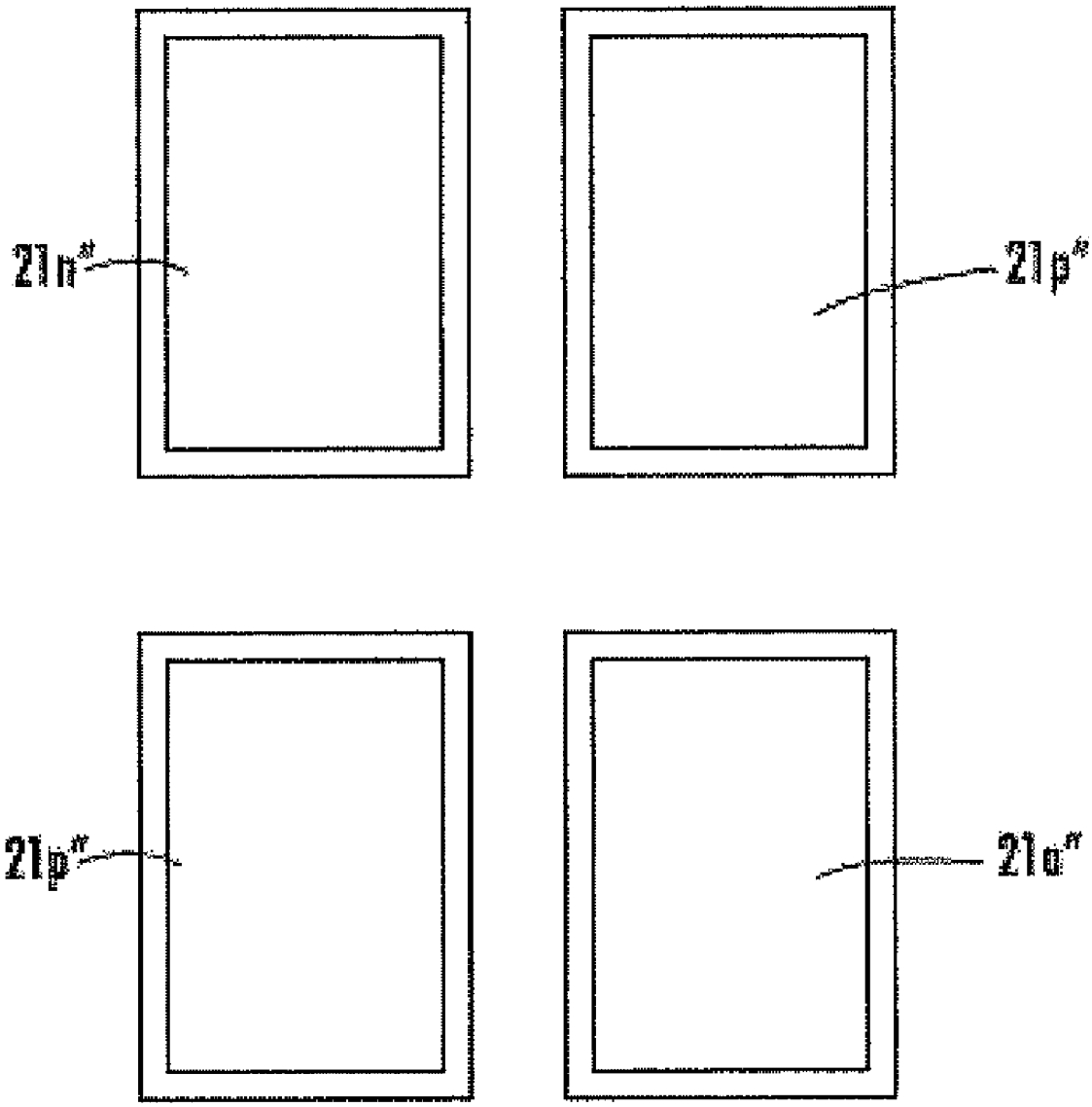
FIGS. 13A and 13B are top views illustrating active area and tab channel-stop masking steps in accordance with another alternative process flow for making the semiconductor device of FIG. 1.
Figure 13B:
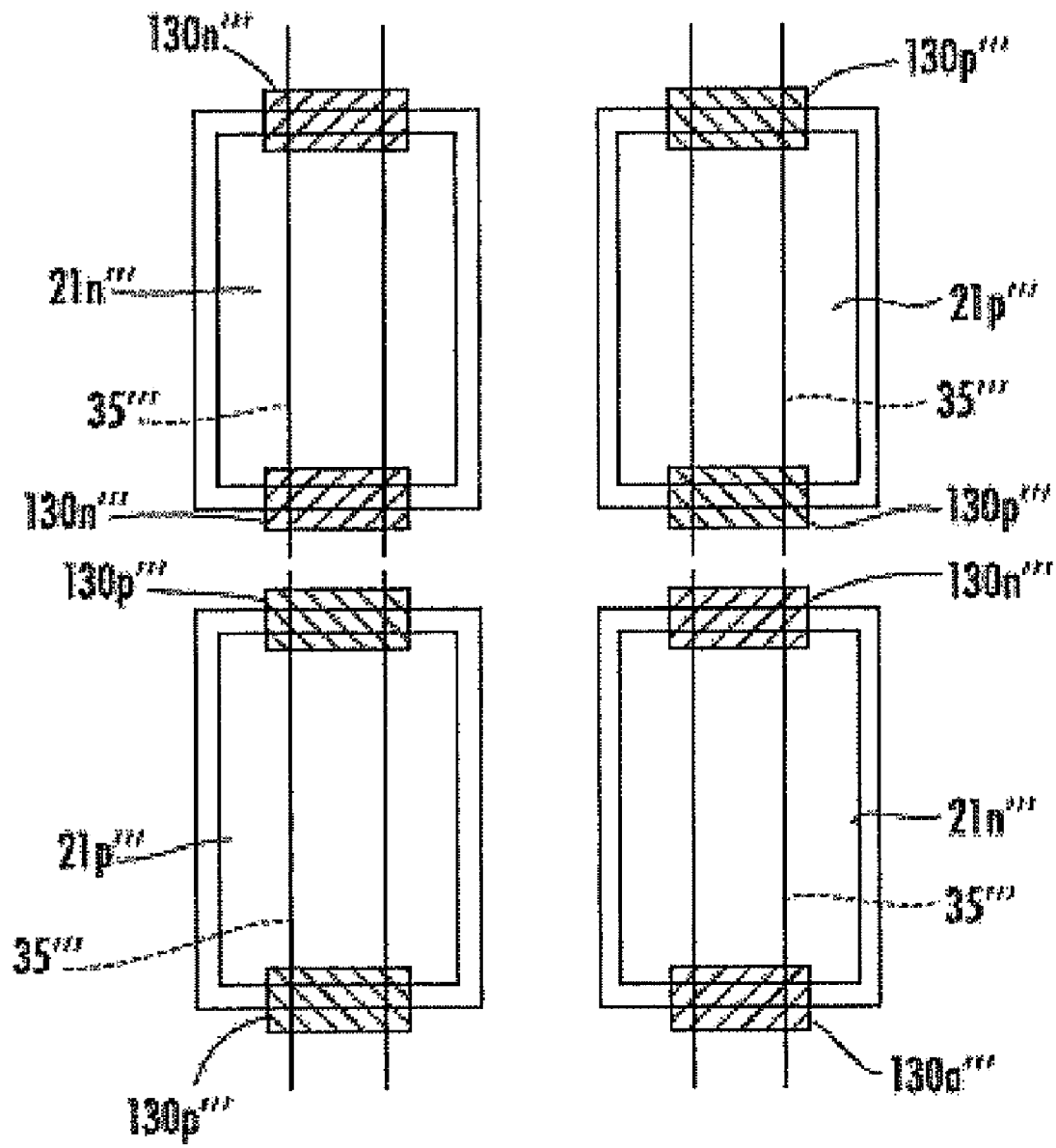

Yet another alternative process flow will now be described with reference to FIGS. 13A and 13B. This process flow uses a common oversized AA mask for etching the non-monocrystalline silicon 86''', 87''' on the STI regions 80''', 81''', followed by two separate masking steps for patterning tab openings. More particularly, an NFET channel-stop mask 130n''' and a PFET channel-stop mask 130p''' are used (FIG. 13B). The NFET and PFET masking steps are followed by channel-stop implantation steps to dope the non-monocrystalline silicon in the tab openings. The foregoing steps may be performed prior to gate oxidation.

It will be appreciated that the exemplary process flows outlined above advantageously allow the etching of the non-monocrystalline semiconductor material on the STI regions prior to gate oxide growth. In addition, the channel-stop implants with appropriate energy and dose would electrically neutralize dopant diffusion from adjacent source and drain regions into any unetched superlattice stringers inadvertently hiding in recessed STI divots at active area edges or tabs of the non-monocrystalline silicon on the STI oxide, surrounding the active area due to the over-sized active-area mask. Of course, it will be appreciated that other suitable materials and process flow parameters besides the exemplary ones noted above may be used in different implementations.

Figure 14:
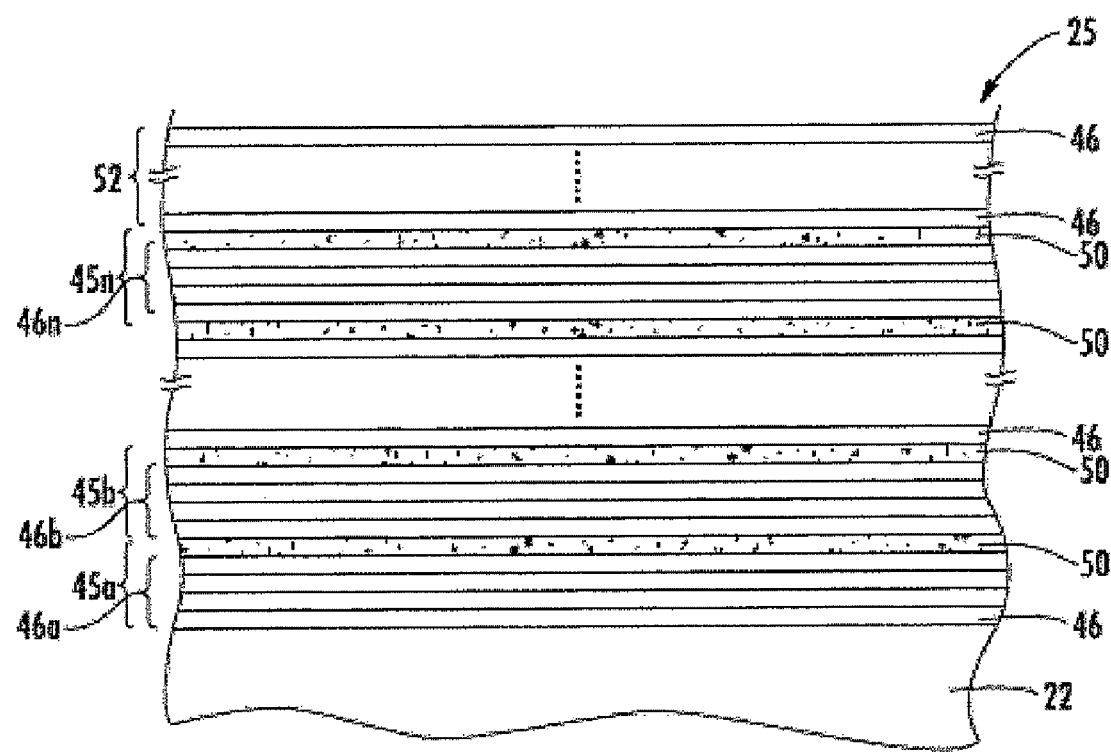
FIG. 14 is a greatly enlarged schematic cross-sectional view of the superlattice as shown in FIG. 1.
Figure 15:
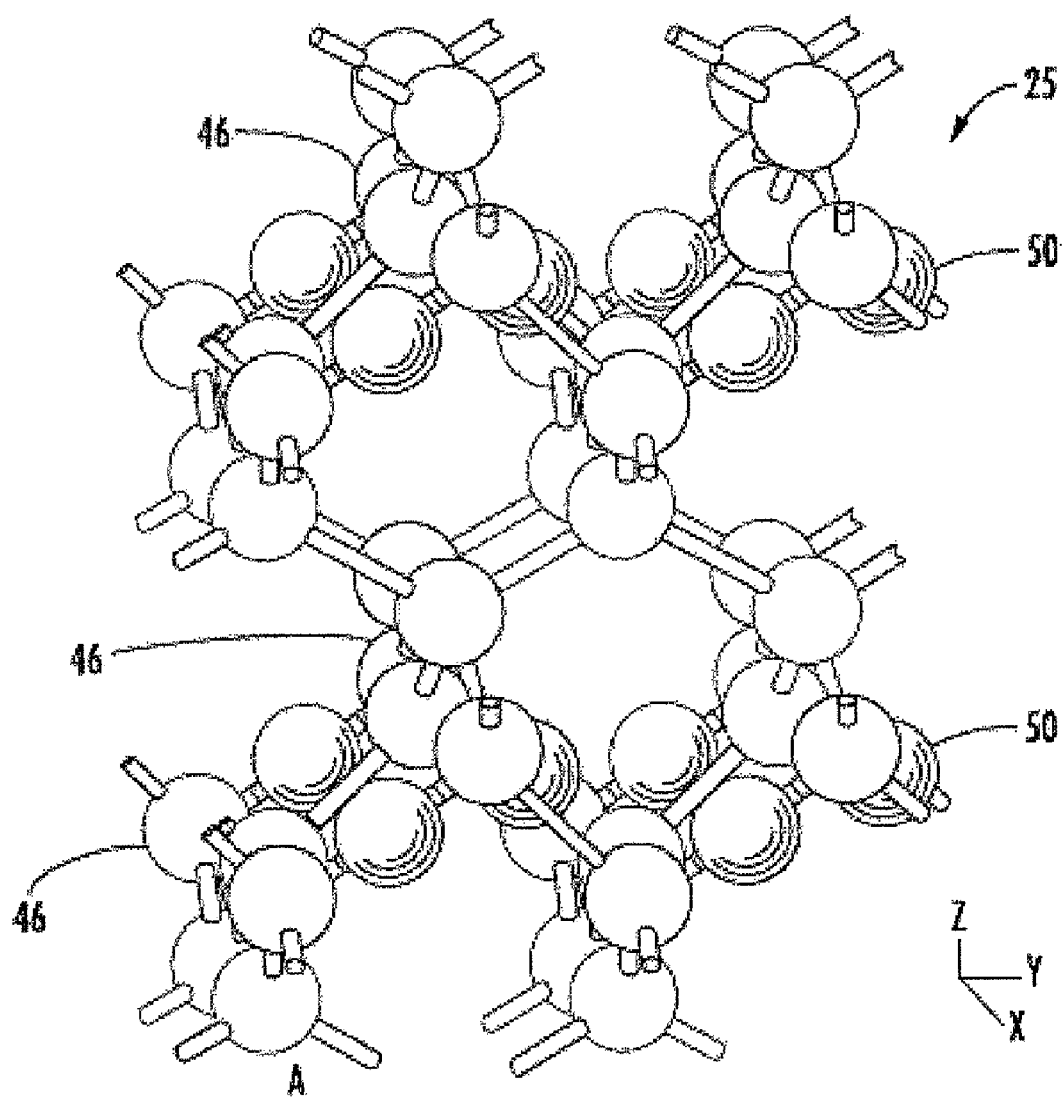
FIG. 15 is a perspective schematic atomic diagram of a portion of the superlattice shown in FIG. 14.

Improved materials or structures for the channel region of the MOSFET 20 having energy band structures for which the appropriate conductivity effective masses for electrons and/or holes are substantially less than the corresponding values for silicon will now be described. Referring now additionally to FIGS. 14 and 15, the superlattice 25 has a structure that is controlled at the atomic or molecular level and may be formed using known techniques of atomic or molecular layer deposition. The superlattice 25 includes a plurality of layer groups 45a-45n arranged in stacked relation, as noted above, as perhaps best understood with specific reference to the schematic cross-sectional view of FIG. 14.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 14 for clarity of illustration.

The energy-band modifying layer 50 illustratively includes one non-semiconductor monolayer constrained within a crystal lattice of adjacent base semiconductor portions. That is, opposing base semiconductor monolayers 46 in adjacent groups of layers 45a-45n are chemically bound together. For example, in the case of silicon monolayers 46, some of the silicon atoms in the upper or top semiconductor monolayer of the group of monolayers 46a will be covalently bonded with silicon atoms in the lower or bottom monolayer of the group 46b. This allows the crystal lattice to continue through the groups of layers despite the presence of the non-semiconductor monolayer(s) (e.g., oxygen monolayer(s)). Of course, there will not be a complete or pure covalent bond between the opposing silicon layers 46 of adjacent groups 45a-45n as some of the silicon atoms in each of these layers will be bonded to non-semiconductor atoms (i.e., oxygen in the present example), as will be appreciated by those skilled in the art.

In other embodiments, more than one non-semiconductor layer monolayer may be possible. By way of example, the number of non-semiconductor monolayers in the energy band-modifying layer 50 may preferably be less than about five monolayers to thereby provide desired energy band-modifying properties.

It should be noted that reference herein to a non-semiconductor or semiconductor monolayer means that the material used for the monolayer would be a non-semiconductor or semiconductor if formed in bulk. That is, a single monolayer of a material, such as semiconductor, may not necessarily exhibit the same properties that it would if formed in bulk or in a relatively thick layer, as will be appreciated by those skilled in the art.

Applicants theorize without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice. Moreover, as noted above, this structure also advantageously provides a barrier to dopant and/or material bleed or diffusion and to carrier flow between layers vertically above and below the superlattice 25.

It is also theorized that the superlattice 25 provides a higher charge carrier mobility based upon the lower conductivity effective mass than would otherwise be present. Of course, all of the above-described properties of the superlattice 25 need not be utilized in every application. For example, in some applications the superlattice 25 may only be used for its dopant blocking/insulation properties or its enhanced mobility, or it may be used for both in other applications, as will be appreciated by those skilled in the art.

A cap layer 52 is on an upper layer group 45n of the superlattice 25. The cap layer 52 may comprise a plurality of base semiconductor monolayers 46. The cap layer 52 may have between 2 to 100 monolayers of the base semiconductor, and, more preferably between 10 to 50 monolayers. Other thicknesses may be used as well.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing, as will be appreciated by those skilled in the art.

It should be noted that the term "monolayer" is meant to include a single atomic layer and also a single molecular layer. It is also noted that the energy band-modifying layer 50 provided by a single monolayer is also meant to include a monolayer wherein not all of the possible sites are occupied. For example, with particular reference to the atomic diagram of FIG. 15, a 4/1 repeating structure is illustrated for silicon as the base semiconductor material, and oxygen as the energy band-modifying material. Only half of the possible sites for oxygen are occupied.

In other embodiments and/or with different materials this one half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without wishing to be bound thereto, that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 14 and 15, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers, as will be appreciated by those skilled in the art. It may also be beneficial to have a decreased carrier mobility in a direction perpendicular to the groups of layers.

The lower conductivity effective mass for the 4/1 Si/O embodiment of the superlattice 25 may be less than two-thirds the conductivity effective mass than would otherwise occur, and this applies for both electrons and holes. It may be especially appropriate to dope some portion of the superlattice 25 in some embodiments, particularly when the superlattice is to provide a portion of a channel as in the device 20, for example. In other embodiments, it may be preferably to have one or more groups of layers 45 of the superlattice 25 substantially undoped depending upon its position within the device.

Figure 16:
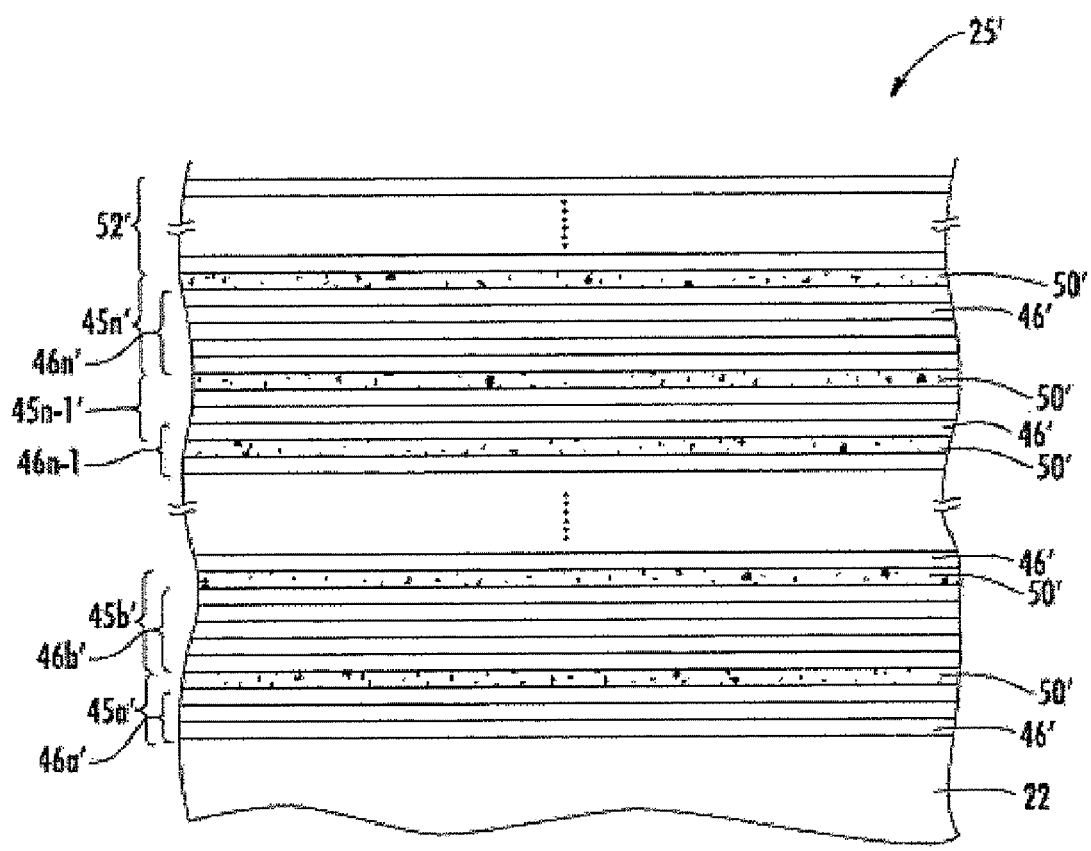
FIG. 16 is a greatly enlarged schematic cross-sectional view of another embodiment of a superlattice that may be used in the device of FIG. 1.

Referring now additionally to FIG. 16, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 16 not specifically mentioned are similar to those discussed above with reference to FIG. 14 and need no further discussion herein.

In some device embodiments, all of the base semiconductor portions $46a$-$46n$ of a superlattice 25 may be a same number of monolayers thick. In other embodiments, at least some of the base semiconductor portions $46a$-$46n$ may be a different number of monolayers thick. In still other embodiments, all of the base semiconductor portions $46a$-$46n$ may be a different number of monolayers thick.

Figure 17A:
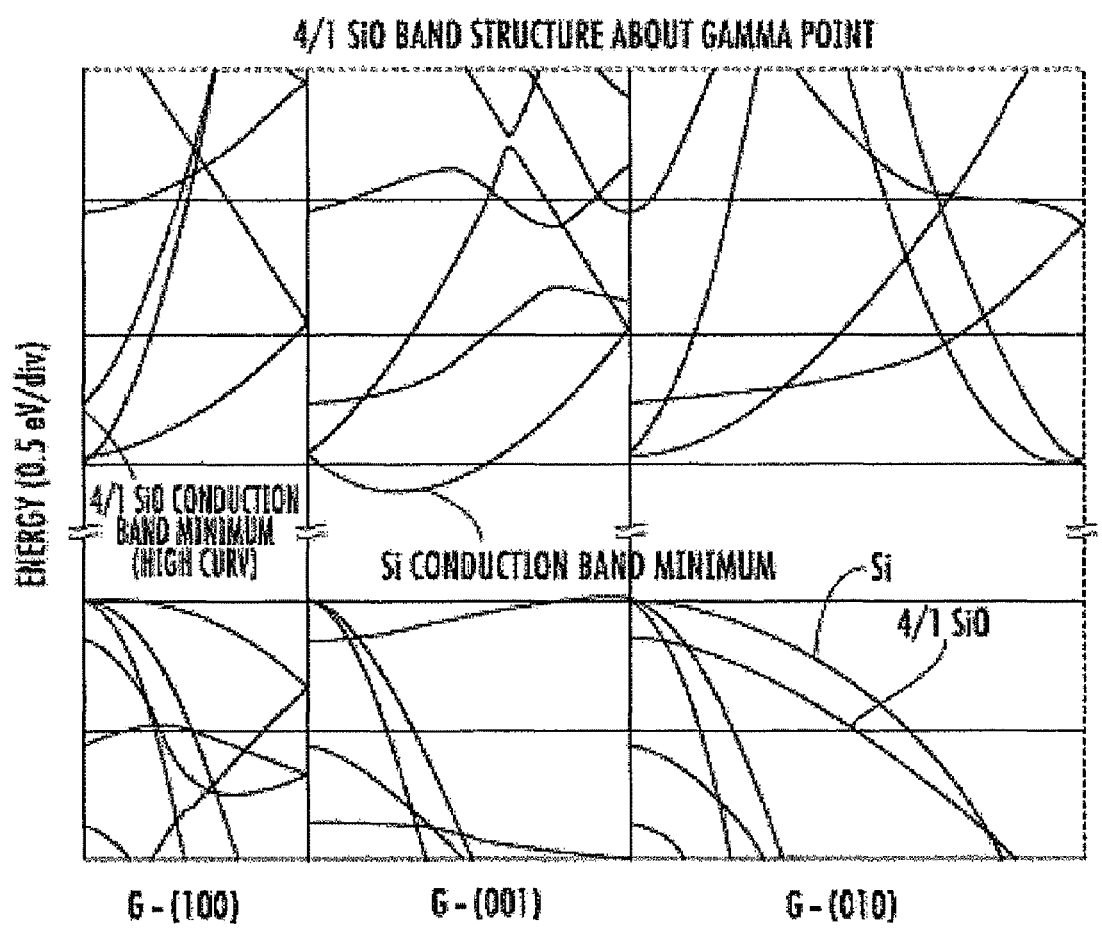
FIG. 17A is a graph of the calculated band structure from the gamma point (G) for both bulk silicon as in the prior art, and for the 4/1 Si/O superlattice as shown in FIG. 14.
Figure 17B:
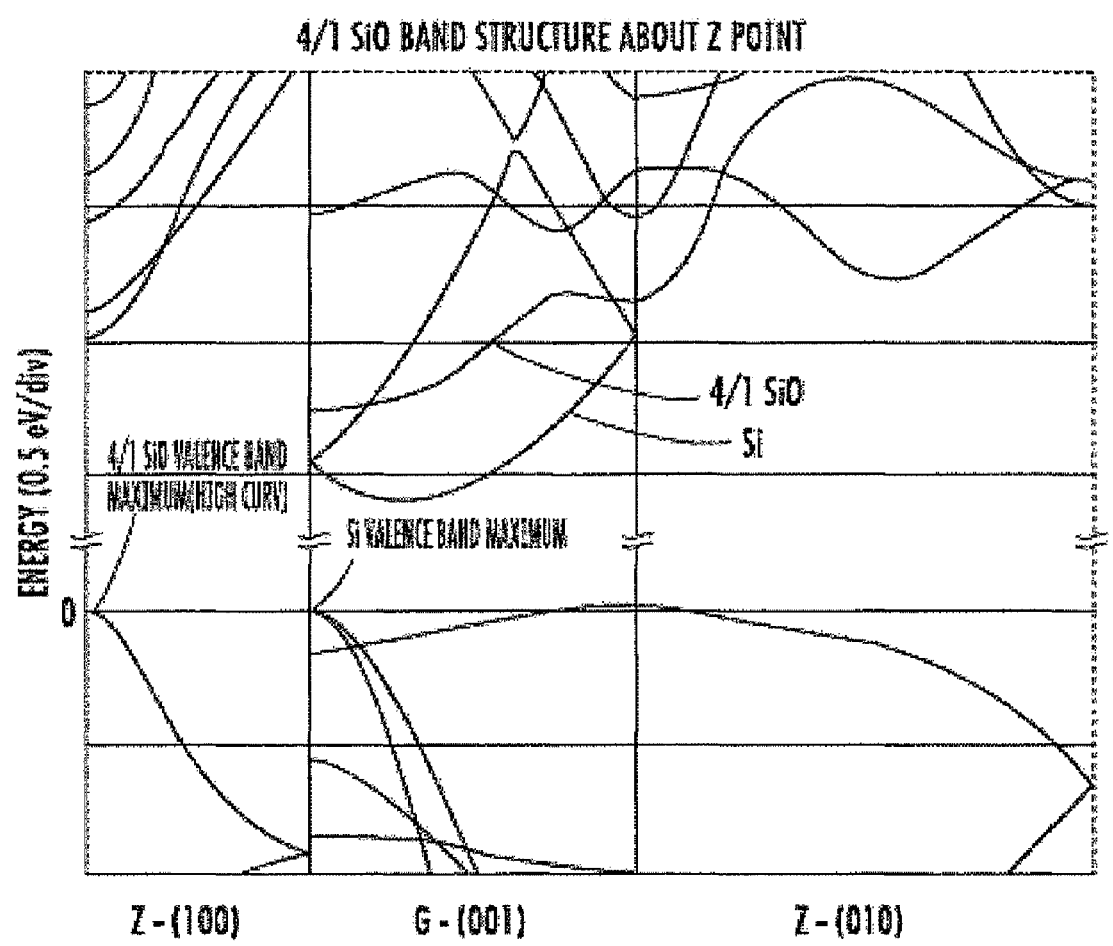
FIG. 17B is a graph of the calculated band structure from the Z point for both bulk silicon as in the prior art, and for the 4/1 Si/O superlattice as shown in FIG. 14.
Figure 17C:
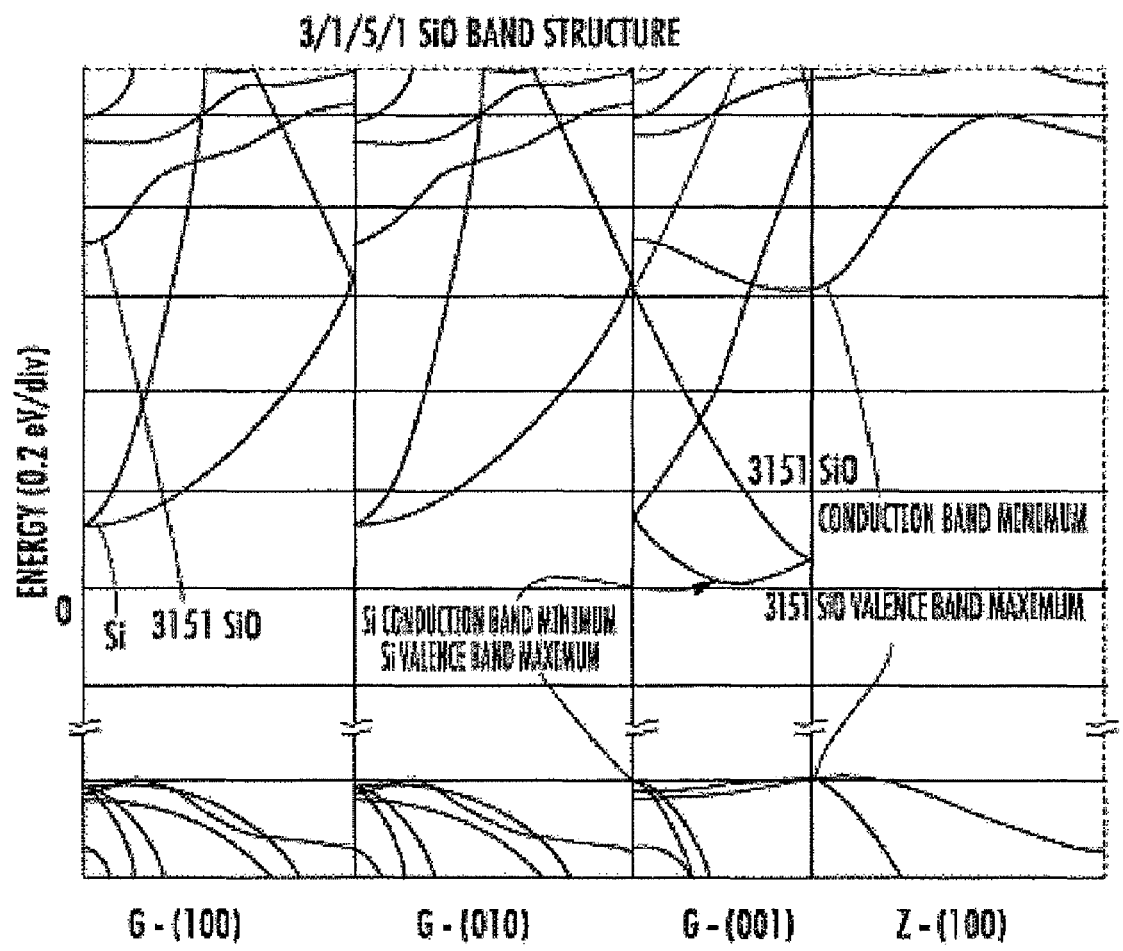
FIG. 17C is a graph of the calculated band structure from both the gamma and Z points for both bulk silicon as in the prior art, and for the 5/1/3/1 Si/O superlattice as shown in FIG. 16.

In FIGS. 17A-17C band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 17A shows the calculated band structure from the gamma point (G) for both bulk silicon (represented by continuous lines) and for the 4/1 Si/O superlattice 25 as shown in FIG. 14 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (–110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 17B shows the calculated band structure from the Z point for both bulk silicon (continuous lines) and for the 4/1 Si/O superlattice 25 (dotted lines) of FIG. 14. This figure illustrates the enhanced curvature of the valence band in the (100) direction.

FIG. 17C shows the calculated band structure from both the gamma and Z point for both bulk silicon (continuous lines) and for the 5/1/3/1 Si/O structure of the superlattice 25' of FIG. 16 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 18:
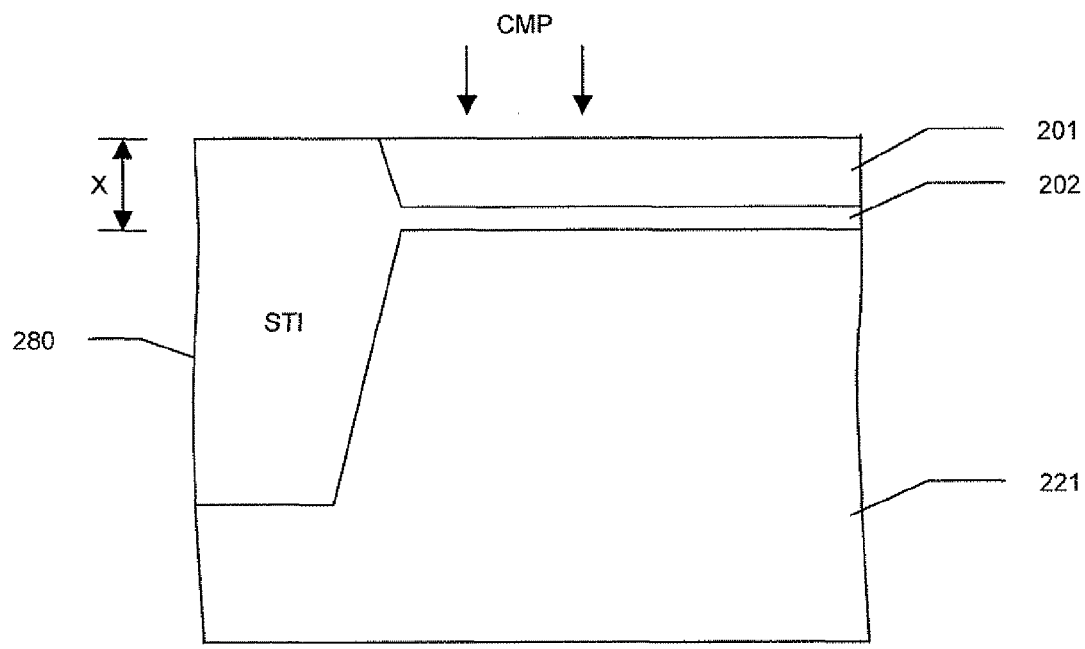
FIGS. 18-25 are a series of schematic cross-sectional diagrams illustrating a method for performing maskless superlattice deposition following STI formation in accordance with the invention.

Referring now additionally to FIGS. 18-26, a method of maskless superlattice deposition after formation of STI structures is now described. In the illustrated embodiment, those layers/regions that are similar to those described above with reference to FIGS. 1-8 are referenced in increments of 200 (e.g., the STI regions 80, 81 are similar to the STI regions 280, 281, etc.), and therefore are not specifically discussed below except to highlight differences or aspects pertinent to the present example. Beginning at Block 260, a slightly thicker nitride stop layer 201, and adjacent portion of the oxide filled STI trench, is left after a STI region formation and subsequent CMP step(s), at Blocks 261-262 (FIG. 18). More particularly, the remaining STI portion above the upper surface of the substrate 221 may have a thickness X of about 450 Å or more, as opposed to a conventional thickness of about 200 Å, although smaller thicknesses may also be used in some embodiments. This additional thickness is such as to leave sufficient vertical step height for formation of a superlattice layer 225 and a protective oxide 237 thereon as described further below. A 150 Å thick oxide layer 202 covers the substrate 221 beneath the nitride layer 201. Those of skill in the art will appreciate the appropriate technique to set the CMP stop point so as to form the slightly thicker nitride layer 201.

Figure 19:
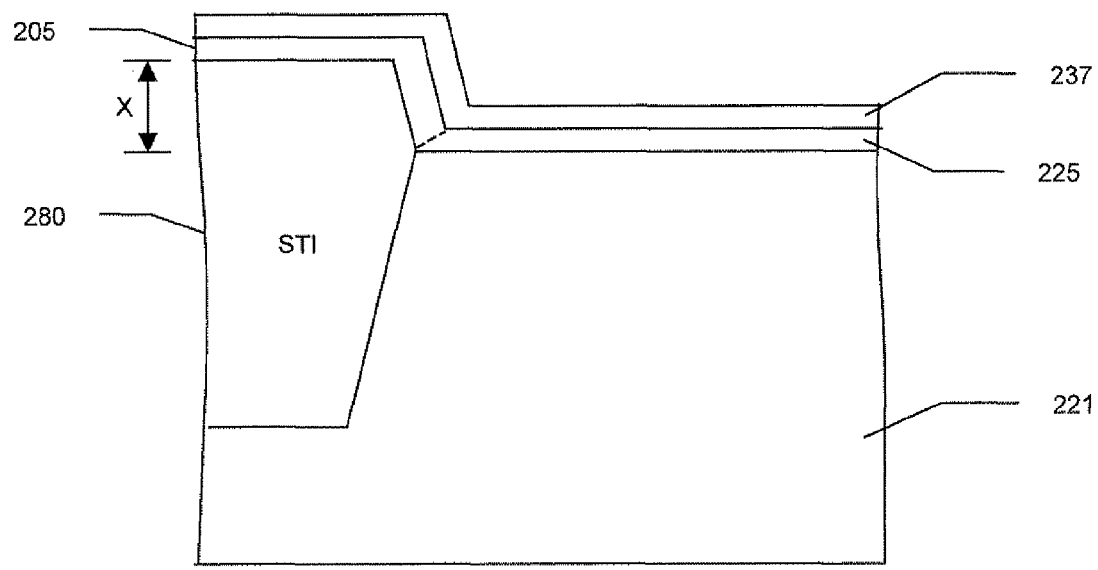

The nitride layer 201 and the oxide layer 202 may then be stripped off of the substrate 221, at Block 263, and a superlattice layer or film 225 formed thereover and over the STI region 280 as shown in FIG. 19 (Block 264). The additional thickness "X" of the STI region 280 above the surface of the substrate 221 (i.e., the portion of the STI region extending above the surface of the substrate) provides a boundary or area between adjacent STI regions to form the superlattice 225 so that a separate masking step advantageously need not be used, as will be appreciated by those skilled in the art. As discussed above, where the superlattice semiconductor monolayers are deposited on the STI oxide the growth will be non-crystalline. This results in a non-monocrystalline superlattice portion 205, as indicated by the dashed boundary between the non-monocrystalline and epitaxial monocrystalline superlattice portions 205, 225, respectively. Additionally, a protective oxide layer 237 may be thermally grown or deposited over the crystalline superlattice layer 225 and non-monocrystalline superlattice 205, at Block 265.

Figure 20:
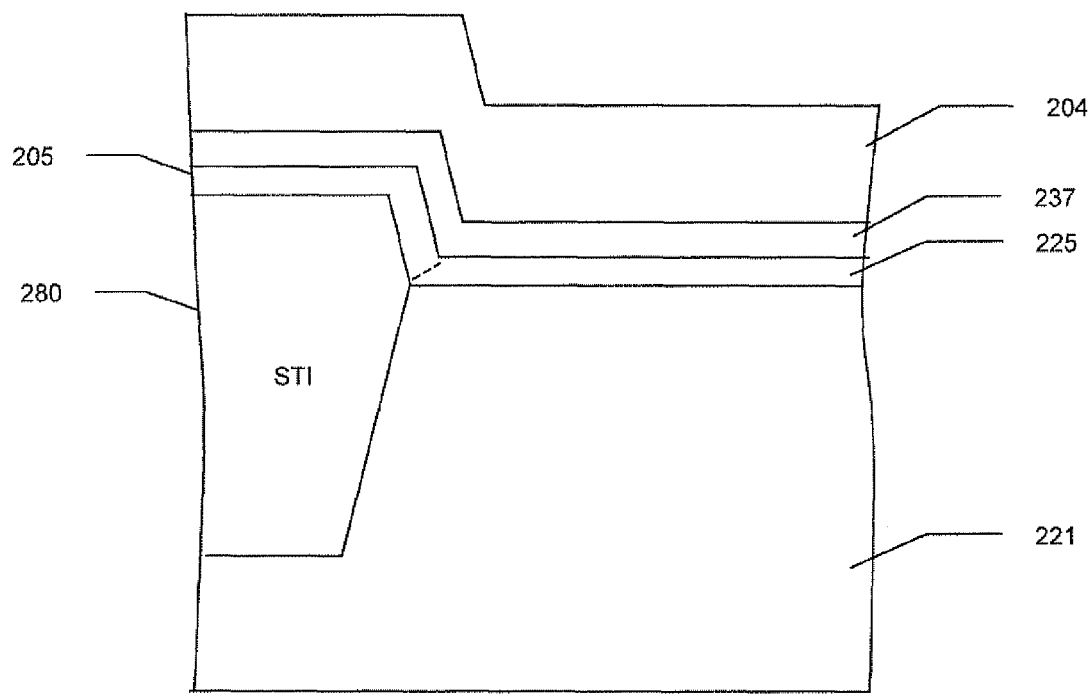
Figure 21:
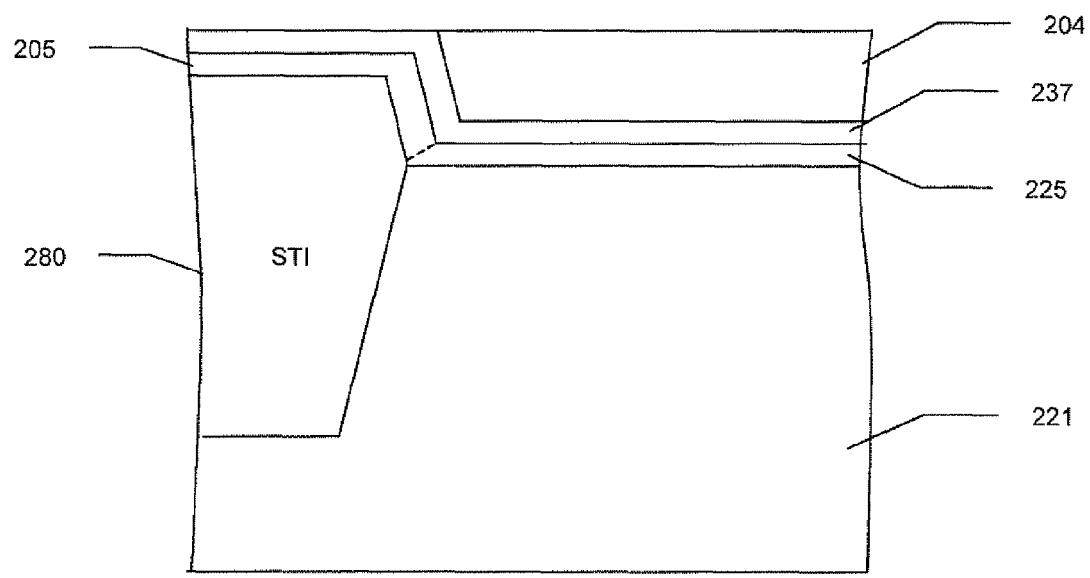
Figure 22:
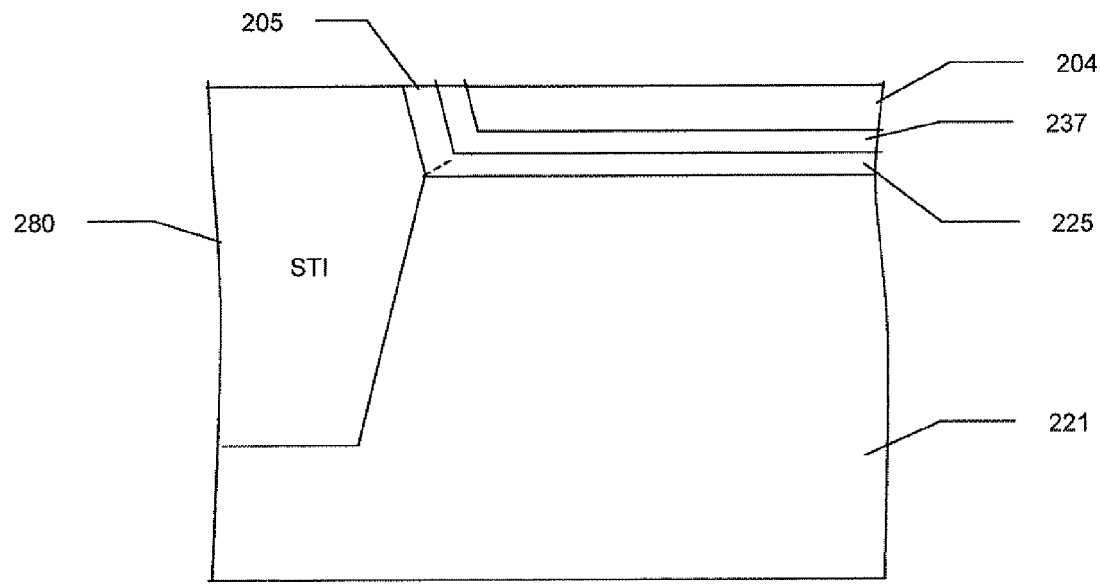

As shown in FIGS. 20 and 21, a nitride layer 204 may be deposited over the structure to a thickness up to about 150 Å, for example, at Block 266, although other thicknesses may be used. This nitride layer 204 may be planarized to the oxide layer by CMP as shown in FIG. 21. For example, this planarization may be for a duration of around 200 seconds for a 150 Å nitride layer 204, but other durations (and layer thicknesses) may also be used. The deposited thickness of the nitride film or layer 204 may be optimized to allow sufficient process window during CMP, so as to reduce dishing or pitting, as will be appreciated by those skilled in the art. As seen in FIG. 22, a wet etch, for example, may be used to remove those portions of the oxide layer 237 and amorphous superlattice layer 205 on the STI region 280, at Block 267. By way of example, a wet etch of the oxide followed by a wet etch of silicon (NH4OH:H2O) at about 60° C. with selectivity to nitride may advantageously be used, as will be appreciated by those skilled in the art, although other suitable etching approaches may also be used. Indeed, the prior CMP step may also be used to remove all or some of the amorphous superlattice layer 205 and oxide layer 203 on the STI structure or region 280, as will also be appreciated by those skilled in the art.

Figure 23:
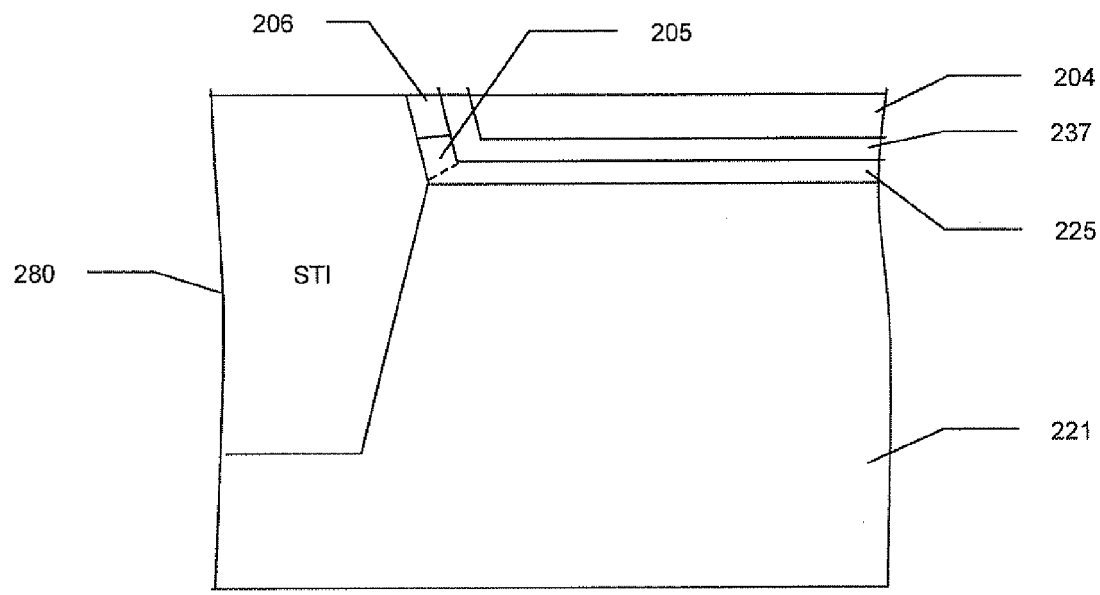
Figure 24:
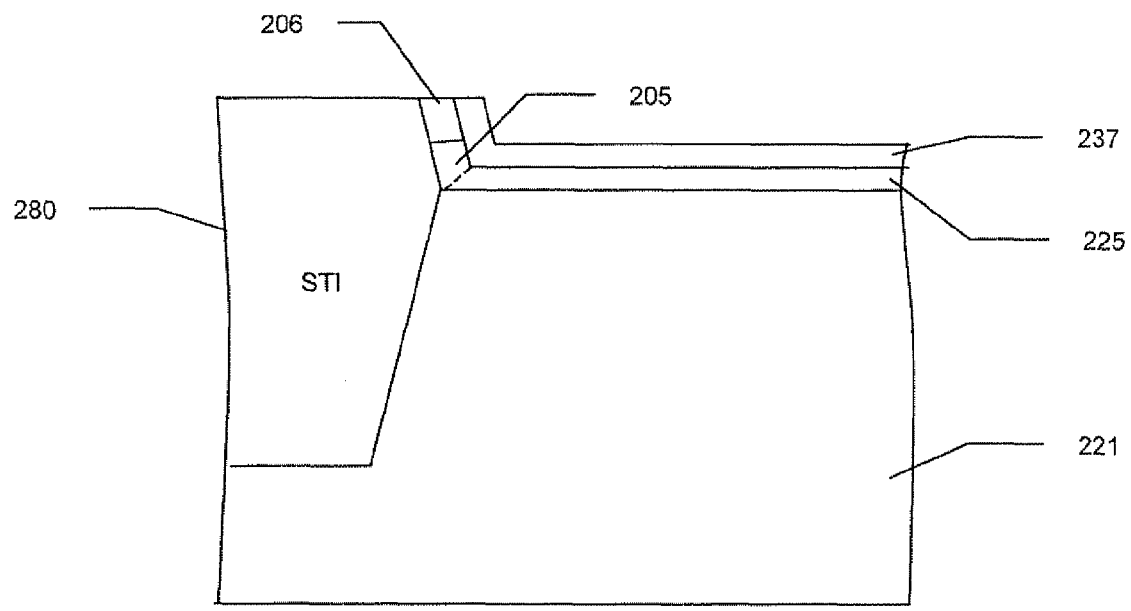
Figure 25:
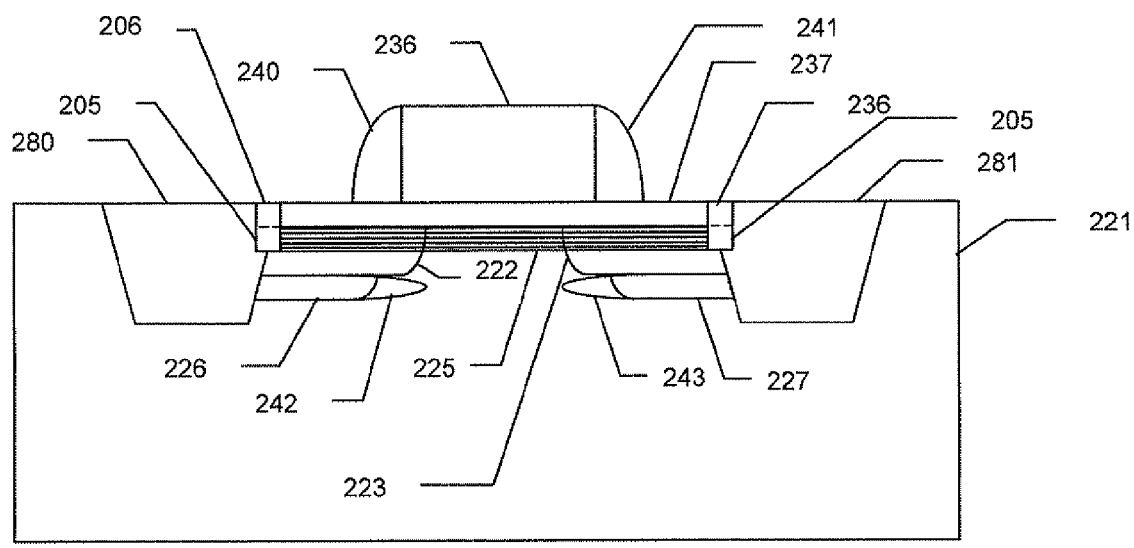
Figure 26:
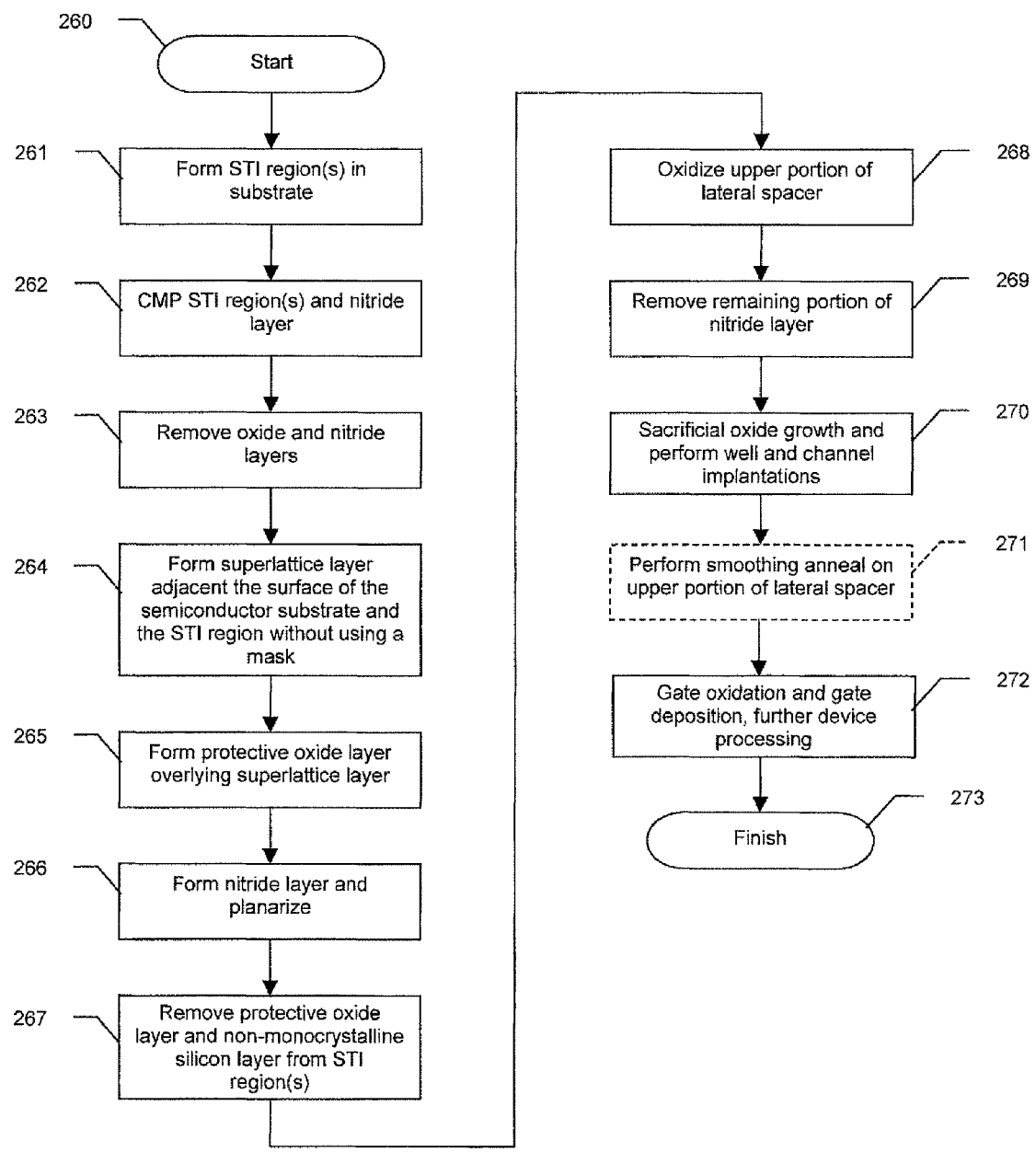
FIG. 26 is a flow diagram corresponding to the method steps illustrated in FIGS. 18-25.

The exposed edge (i.e., the top) of the remaining non-monocrystalline superlattice portion 205 on STI regions may be removed with a plasma etch or wet etch, with high selectivity to the nitride mask on the active area. The next step is the spacer or "tab" oxidation 206 to oxidize (~150 Å oxide) and consume the edges of the superlattice film. This may be performed at about 850° C. using a wet oxidation, although other suitable approaches may also be used. This tab oxide 206 protects the edges of the superlattice film 225, at Block 268 from getting exposed to the hot phosphoric acid during the subsequent nitride mask strip, as shown in FIG. 23. Thereafter, the remaining portion of the nitride layer 204 may be removed by wet etching, for example, leaving the structure as shown in FIG. 24 (Block 269). The manufacturing process may continue with implanting the well and channel implants through the oxide (Block 270), etc., as will be appreciated by those skilled in the art. If desired, the superlattice film 225 may optionally be subjected to a smoothing anneal after removal of the oxide layer, at Block 271, as will also be appreciated by those skilled in the art. Additional processing steps may include gate oxidation and deposition to form a gate 236, sidewall spacer 240, 241 formation, etc., to provide the exemplary structure illustrated in FIG. 25, at Block 272, although different embodiments are also possible for different applications, thus concluding the method illustrated in FIG. 26 (Block 273).

Many modifications and other embodiments will come to the mind of one skilled in the art having the benefit of the teachings presented in the foregoing descriptions and the associated drawings. Therefore, it is understood that such modifications and embodiments are intended to be included within the scope of the appended claims.

That which is claimed is:

1. A semiconductor device comprising:
   a semiconductor substrate having a surface;
   a shallow trench isolation (STI) region in said semiconductor substrate and extending above the surface thereof;
   a superlattice layer adjacent the surface of said semiconductor substrate and comprising a plurality of stacked groups of layers;
   each group of layers of said superlattice layer comprising a plurality of stacked base semiconductor monolayers defining a base semiconductor portion and at least one non-semiconductor monolayer constrained within a crystal lattice of adjacent base semiconductor portions, and wherein at least some atoms from opposing base semiconductor portions are chemically bound together with the chemical bonds traversing the at least one intervening non-semiconductor monolayer; and
   a lateral spacer between said superlattice layer and said STI region and comprising a lower non-monocrystalline semiconductor superlattice portion and an upper dielectric portion.

2. The semiconductor device of claim 1 wherein said upper dielectric portion comprises an oxide.

3. The semiconductor device of claim 1 wherein said lower non-monocrystalline semiconductor superlattice portion comprises a plurality of stacked base non-monocrystalline semiconductor monolayers defining an a non-monocrystalline base semiconductor portion and at least one non-semiconductor monolayer between adjacent base non-monocrystalline semiconductor portions.

4. The semiconductor device of claim 1 wherein said lateral spacer extends vertically upward from said substrate and along a sidewall of said STI region.

5. The semiconductor device of claim 1 further comprising an oxide layer overlying said superlattice layer.

6. The semiconductor device of claim 1 wherein said base semiconductor comprises silicon.

7. The semiconductor device of claim 1 wherein each base semiconductor portion comprises a base semiconductor selected from the group consisting of Group IV semiconductors, Group III-V semiconductors, and Group II-VI semiconductors.

8. The semiconductor device of claim 1 wherein said at least one non-semiconductor monolayer comprises oxygen.

9. The semiconductor device of claim 1 wherein said at least one non-semiconductor monolayer comprises a non-semiconductor selected from the group consisting of oxygen, nitrogen, fluorine, and carbon.

10. A method of making a semiconductor device comprising:
    forming a shallow trench isolation (STI) region in a semiconductor substrate and extending above a surface thereof;
    forming a superlattice layer adjacent the surface of the semiconductor substrate and comprising a plurality of stacked groups of layers;
    each group of layers of the superlattice layer comprising a plurality of stacked base semiconductor monolayers defining a base semiconductor portion and at least one non-semiconductor monolayer constrained within a crystal lattice of adjacent base semiconductor portions, and wherein at least some atoms from opposing base semiconductor portions are chemically bound together with the chemical bonds traversing the at least one intervening non-semiconductor monolayer; and
    forming a lateral spacer between the superlattice layer and the STI region and comprising a lower non-monocrystalline semiconductor superlattice portion and an upper dielectric portion.

11. The method of claim 10 wherein the upper dielectric portion comprises an oxide.

12. The method of claim 10 wherein the lower non-monocrystalline semiconductor superlattice portion comprises a plurality of stacked base non-monocrystalline semiconductor monolayers defining an a non-monocrystalline base semiconductor portion and at least one non-semiconductor monolayer between adjacent base non-monocrystalline semiconductor portions.

13. The method of claim 10 wherein the lateral spacer extends vertically upward from the substrate and along a sidewall of the STI region.

14. The method of claim 10 further comprising forming an oxide layer overlying the superlattice layer.

15. The method of claim 10 wherein each base semiconductor portion comprises a base semiconductor selected from the group consisting of Group IV semiconductors, Group III-V semiconductors, and Group II-VI semiconductors.

16. The method of claim 10 wherein the at least one non-semiconductor monolayer comprises a non-semiconductor selected from the group consisting of oxygen, nitrogen, fluorine, and carbon.

17. A method of making a semiconductor device comprising:
   forming a shallow trench isolation (STI) region in a semiconductor substrate and extending above a surface thereof;
   forming a superlattice layer adjacent the surface of the semiconductor substrate and the STI region without using a mask, the superlattice comprising a plurality of stacked groups of layers;
   each group of layers of the superlattice layer comprising a plurality of stacked base semiconductor monolayers defining a base semiconductor portion and at least one non-semiconductor monolayer constrained within a crystal lattice of adjacent base semiconductor portions, and wherein at least some atoms from opposing base semiconductor portions are chemically bound together with the chemical bonds traversing the at least one intervening non-semiconductor monolayer; and
   forming a lateral spacer between the superlattice layer and the STI region and comprising a lower non-monocrystalline semiconductor superlattice portion and an upper dielectric portion.

18. The method of claim 17 wherein the upper dielectric portion comprises an oxide.

19. The method of claim 17 wherein the lower non-monocrystalline semiconductor superlattice portion comprises a plurality of stacked base non-monocrystalline semiconductor monolayers defining a non-monocrystalline base semiconductor portion and at least one non-semiconductor monolayer between adjacent base non-monocrystalline semiconductor portions.

20. The method of claim 17 wherein the lateral spacer extends vertically upward from the substrate and along a sidewall of the STI region.

21. The method of claim 17 further comprising forming an oxide layer overlying the superlattice layer.

22. The method of claim 17 wherein each base semiconductor portion comprises a base semiconductor selected from the group consisting of Group IV semiconductors, Group III-V semiconductors, and Group II-VI semiconductors.

23. The method of claim 17 wherein the at least one non-semiconductor monolayer comprises a non-semiconductor selected from the group consisting of oxygen, nitrogen, fluorine, and carbon.

* * * * *